(12) United States Patent
Ozaki et al.

(10) Patent No.: US 6,611,015 B2
(45) Date of Patent: Aug. 26, 2003

(54) SEMICONDUCTOR DEVICE INCLUDING DUMMY UPPER ELECTRODE

(75) Inventors: Tohru Ozaki, Tokyo (JP); Iwao Kunishima, Kanagawa-ken (JP); Toyota Morimoto, Kanagawa-ken (JP); Hiroyuki Kanaya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/956,001

(22) Filed: Sep. 20, 2001

(65) Prior Publication Data

US 2002/0033494 A1 Mar. 21, 2002

(30) Foreign Application Priority Data

Sep. 20, 2000 (JP) ........................................ 2000-284710

(51) Int. Cl.[7] ............................................. H01L 27/108
(52) U.S. Cl. ...................... 257/296; 257/295; 257/298; 257/308; 257/311
(58) Field of Search ................................ 257/295, 296, 257/298, 306, 308, 311; 438/3, 239, 253

(56) References Cited

U.S. PATENT DOCUMENTS

| 5,281,555 A | * | 1/1994 | Cho | ........................... | 438/625 |
| 5,361,234 A | * | 11/1994 | Iwasa | ........................... | 365/210 |
| 5,410,161 A | * | 4/1995 | Narita | ........................... | 257/41 |
| 5,689,126 A | * | 11/1997 | Takaishi | ........................... | 257/306 |

FOREIGN PATENT DOCUMENTS

| JP | 4-05-129552 | * | 5/1993 | ................. | 257/202 |
| JP | 4-08-181290 | * | 7/1996 | ......... | H01L/27/108 |
| JP | 4-11-354727 | * | 12/1999 | ........... | H01L/27/10 |

OTHER PUBLICATIONS

Takashima et al., A Sub–40ns Random–Access Chain FRAM Architecture with a 7ns Cell–Plate–Line Drive, 1999, IEEE, International Solid State Circuits Conference, pp. 102, 103, 150.*
Takeshima et al., Gain Cell Block Architecture for Gigabit–Scale Chain Ferroelectric RAM, Jun. 1999, Symposium on VLSI Circuits Digest of Technical Papers, pp. 103–104.*
U.S. patent application Ser. No. 09/801,920, Kanaya et al., filed Mar. 9, 2001.
U.S. patent application Ser. No. 09/956,001, Ozaki et al., filed Sep. 20, 2001.
U.S. patent application Ser. No. 10/178,744, Kanaya et al., filed Jun. 25, 2002.

* cited by examiner

Primary Examiner—George Eckert
(74) Attorney, Agent, or Firm—Oblon, Spivak, McClelland, Maier & Neustadt, P.C.

(57) ABSTRACT

A semiconductor memory device including a memory cell block having a plurality of memory transistors formed on a semiconductor substrate. The memory transistors include first and second impurity-diffused regions and a gate formed therebetween. A plurality of memory cells are also included in the memory cell block and have lower electrodes connected to the first impurity-diffused regions, ferroelectric films formed on the lower electrodes and first upper electrodes formed on the ferroelectric films and connected to the second impurity-diffused regions. Further included are block selecting transistors formed on the semiconductor substrate and being connected to one end of the memory cell block. Second upper electrodes are also formed adjoined to the block selecting transistors and being disconnected from the first upper electrode of the memory cells.

29 Claims, 24 Drawing Sheets

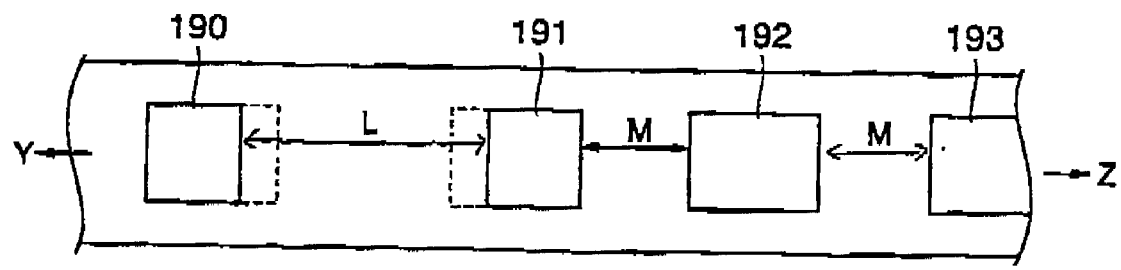
FIG. 40 (A) RELATED ART
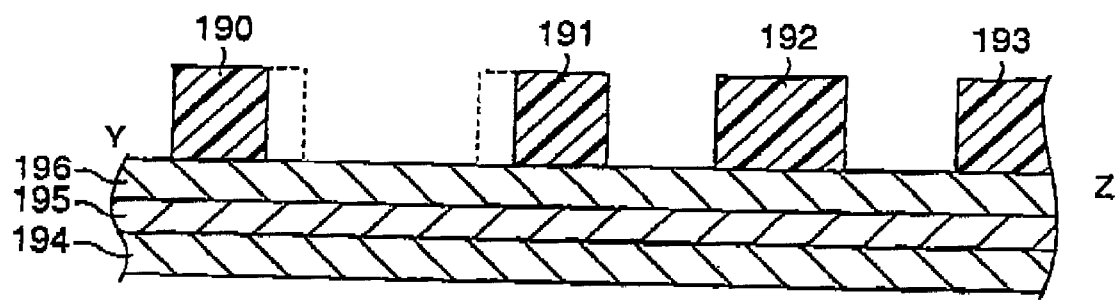
FIG. 40 (B) RELATED ART

SEMICONDUCTOR DEVICE INCLUDING DUMMY UPPER ELECTRODE

CROSS REFERENCE TO A RELATED APPLICATION

This application is based upon and claims benefit of priority from the prior Japanese Patent Application No. 2000-284710, filed on Sep. 20, 2000; the entire contents of which are incorporated herein by reference.

BACKGROUND OF THE INVENTION

1. Field of the Invention

The present invention relates to a semiconductor memory having ferroelectric capacitors. Particularly, this invention relates to non-volatile semiconductor memories having ferroelectric capacitors in high density and methods of fabricating such non-volatile semiconductor memories.

2. Discussion of the Background

A memory which includes series connected memory cells each having a transistor with a source terminal and a drain terminal and a ferroelectric capacitor in between the two terminals (hereinafter named "Series connected TC unit type ferroelectric RAM") have been developed for highly reliable non-volatile semiconductor memories with low power consumption and high density.

Such non-volatile semiconductor memories are described in FIG. 34. The feature of this type of memory is a memory cell including one transistor and one capacitor, and a plurality of memory cells are connected in series. Namely, a lower electrode of a capacitor of the memory cell is connected to one of the source-drain regions formed adjacent to a gate, and an upper electrode of a capacitor of the memory cell is connected to the other of the source-drain regions.

In this structure, one block of memory cells usually includes eight bits unit cells or 16 bits unit cells. Each block is electrically disconnected in consideration of an increase of the capacitance of bit lines or resistance of performing a switching operation on switching transistors. One block of memory cells is usually disconnected by block selecting transistors. Further, it is necessary to arrange a plate line which drives a capacitor electrode in an opposite direction of a capacitor connected to the bit lines on the opposite direction in one block. Such a feature is disclosed in the "JSSCC, pp 787–792, May, 1998, D. Takashima et al," and U.S. Pat. No. 5,903,492, the entire contents of these references being incorporated herein by reference.

The conventional semiconductor device having the ferroelectric capacitors in the "Series connected TC unit type ferroelectric RAM" is described with respect to FIGS. 35–40. In FIG. 35, an upper side of the conventional semiconductor device of the block selector portion is shown. In this drawing, there are two block selectors and two memory cell blocks on regions arranged on two parallel lines. FIG. 36 illustrates a sectional drawing as the line "S–T" of FIG. 35.

A block selecting transistor includes a first gate 100, a first impurity-diffused region 101, and a second impurity-diffused region 102 formed on a semiconductor substrate 103. A first bit line contact wire 104 is connected to the first impurity-diffused region 101 and a first metal wire contact 105 is connected to the first bit line contact wire 104. A second bit line contact wire 106 is connected to the first metal wire contact 105, and a bit line 107 is connected to the second bit line contact wire 106.

Further, a first cell transistor includes the second impurity-diffused region 102, a second gate 108 and a third impurity-diffused region 109 formed on the semiconductor substrate 103 and adjoined to the block selecting transistor.

In addition, a first capacitor includes a first lower electrode 110, a first ferroelectric layer 112 and a first upper electrode 113 formed over the second-impurity diffused region 102 and the second gate 108. The first lower electrode 110 is connected to the second-impurity diffused region 102 by a polysilicon plug 114.

A contact plug 115 is connected to the third impurity-diffused region 109. A first metal wiring 116 is connected to the contact plug 115, and a first metal contact 117 is formed and connected between the first upper electrode 113 and the first metal wiring 116.

Note a first memory cell includes the first cell transistor and the first capacitor. A second cell transistor includes the third impurity-diffused region 109, a third gate 118 and a fourth impurity-diffused region 119. A second capacitor includes a second lower electrode 450 formed over the third gate 118 and the fourth impurity-diffused region 119. The second ferroelectric layer 120 is formed on the second lower electrode 450, and a second upper electrode 121 is formed on the second ferroelectric layer 120. The second lower electrode 450 is connected to the fourth impurity-diffused region 119 by a second polysilicon plug 122. Further, a second metal contact 123 is formed and connected between the second upper electrode 121 and the first metal wiring 116.

Note a second memory cell includes the second cell transistor and the second capacitor. In addition, as shown, an isolation region 124 is formed on the semiconductor substrate 103 adjacent to the first impurity-diffused region 101.

Because of a micro loading effect, the cross sectional shape of the first upper electrode 113 may be damaged or changed in comparison with the second upper electrode 121. In more detail, the micro loading effect is caused by the difference of the distance between upper electrodes. Particularly, the length between the first upper electrode and another upper electrode is longer than the length between the first upper electrode and the second upper electrode.

In the memory cell, there are cyclical patterns of each memory capacitor, so there is the same length between each upper electrode in the memory cell area in each block. In a similar way, the lower electrodes are easily affected by the micro loading effect and the sectional shape thereof is easily varied in a neighbor of the block selecting transistor.

The micro loading effect is a significant physical phenomenon for the 0.3 micrometer scale. This effect is caused by a resist shape shrink because of over-etching of the resist at the specific point of an inperiodically portion, which is a different scale from the other portion.

Namely, while the etching step is performed, the etching speed of the non-periodical portion of the upper electrode is varied from the other upper electrode of the periodically portion. Thus, the edge portion of the resist for the upper electrode of the imperiodically portion may be varied from a predetermined shape. Further, in the end portion of the memory block, there is a relatively wide opening of the resist for the upper electrode. Therefore, the desired shape of resist of the portion in the end portion of the memory block is hardly acquired, in comparison with the other portion of the memory block, which have memory cells at even intervals.

Further, two memory blocks are facing each other by positioning two block selecting transistors between them. At the end portion of the memory blocks, the distance between upper electrodes in the end portions in each neighboring memory block is equal to the length of the two block selecting transistors and is 1.5 times the distance between two upper electrodes in a normal capacitor portion of the memory block. Therefore, the upper electrode of the end portion is reduced 70–90 percent compared to other normal upper electrodes.

In more detail, the step of forming a conventional upper electrode is shown in FIGS. 40(A) and 40(B). In FIG. 40(A), an overview of the resist pattern as the desired shape disposed on the upper electrode is shown. As shown, two resists 190, 191 facing a block selecting transistor are largely isolated a length of "L" greater than the interval length "M" of other resists 192, 193.

In FIG. 40(B), the cross sectional view on the line of "Y–Z" of the FIG. 40(A) is shown. In this figure, an upper electrode material 196 is provided on the ferroelectric layer 195. Also shown are the resists 190, 191, 192, 193 for forming the upper electrode on the upper electrode material 196. Further, the broken line portions show the over etched portions of the resists for forming the upper electrodes. Note if there are even intervals between the upper electrodes, such broken line portions may become portions of the resists for forming the upper electrodes.

After forming the upper electrodes, the ferroelectric layers and lower layers are formed in sequence. Because of this manufacturing sequence, the sizes of the upper electrodes are relatively smaller than those of the ferroelectric layers or lower electrodes. Namely, a redundant area for etching the ferroelectric layers or lower electrodes is needed, and thus positioning margins on the ferroelectric layers uncovered by the upper electrodes are provided. In addition, the sizes of the upper electrodes are formed smaller than those of the ferroelectric layers for preparing the redundant area without the upper electrode on the ferroelectric layers.

In addition, as discussed above, FIG. 36 illustrates a cross section of the line "S–T" in FIG. 35. FIG. 37 illustrates a memory block adjacent to the memory block in FIG. 36 including a block selecting transistor and memory cells of the cross sectional view of the line "U–V" and its extension in FIG. 35.

As shown in FIG. 37, a second block selecting transistor includes a fourth gate 130, a fifth impurity-diffused region 131, and a sixth impurity-diffused region 132 formed on the semiconductor substrate 103. Further, a third bit line contact wire 133 is connected to the fifth impurity-diffused region 131, and a second metal wire contact 134 is connected to the third bit line contact wire 133. A fourth bit line contact wire 135 is connected to the second metal wire contact 134, and a second bit line 136 is connected to the fourth bit line contact wire 135.

In addition, an isolation layer 137 is formed on the semiconductor substrate 103 and is adjacent to the sixth impurity-diffused region 132. A passing word line is formed on the isolation area 137, and in which the passing word line is the first gate 100 of the block selecting transistor as shown in FIG. 36.

Also, a third cell transistor includes a seventh impurity-diffused region 138, a second gate 108 and an eighth impurity-diffused region 139 formed on the semiconductor substrate 103, and the seventh impurity-diffused region 138 is adjoined to the isolation layer 137.

A third capacitor includes a third lower electrode 140, a third ferroelectric layer 141 and a third upper electrode 142 formed over the eighth impurity-diffused region 139 and the second gate 108. The third lower electrode 140 is connected to the eighth impurity diffused region 139 by a third polysilicon plug 143.

In addition, a second contact plug 144 is connected to the seventh impurity-diffused region 138, and a second metal wiring 145 is connected to the second contact plug 144. A third metal contact 146 is also formed between the third upper electrode 142 and the second metal wiring 145 and is connected to them.

Note a fourth cell transistor includes the eighth impurity-diffused region 139, the third gate 118 and a ninth impurity-diffused region 147. Further, the third lower electrode 140 and the third ferroelectric layer 141 are formed over the third gate 118 and the eighth impurity diffused region 139. A fourth capacitor includes the third lower electrode 140, the third ferroelectric layer 141, and a fourth upper electrode 148 formed over the third gate 118.

Note a fourth memory cell includes a fourth cell transistor and a fourth capacitor.

The fourth upper electrode 148 is formed on the third ferroelectric layer 141 and over the third gate 118. Also, a fourth metal contact 149 is formed on the fourth upper electrode 148, and a third metal wiring 150 is formed on the fourth metal contact 149. A third contact plug 151 is formed on the sixth impurity diffused region 132 and is connected to the second metal wiring 145. Further, as described above, the third memory cell placed in the end portion of the memory block is connected to the second block selecting transistor.

In this structure shown in FIG. 37, the connection between the sixth impurity-diffused region 132 and the seventh impurity-diffused region 138 with the isolation layer 137 therebetween includes a second metal wiring 145 in the same level as the metal layer between the upper electrode and the impurity-diffused region, so another word line such as a multilevel word line has to be formed by using other layers of the second metal wiring 145 or the second bit line 136 formed on the second metal wiring 145. It is inconvenient to use three layers for connecting over the isolation layer, bit line and multilevel word line. That is, if more layers are used, the manufacturing process is becomes more complicated.

By using a Capacitor On Plug (COP) type structure, the area size is reduced in half compared to the offset type. However, the area of the block selecting transistor is increased. In addition, the connection between the sixth impurity-diffusion region 132 and the seventh impurity diffusion region 138 with the second metal wiring 145 may cause the area of the block selecting transistor to be determined by the density of the second meal wiring 145.

Thus, the memory cell area is mainly determined and increased by the distance between the second contact plug 144 and the third metal contact 146, the distance between the second contact plug 144 and the fourth metal contact 149, or the distance between the second metal wiring 145 and the third metal wiring 150. In contrast, the distance between the second contact plug 144 and the second gate 108, or the distance between the second gate 108 and the far end point of the seventh impurity-diffused region 138 does not significantly affect the area of the memory cell.

Further, FIG. 38 shows an overview of the portion of the plate line area of two memory blocks and FIG. 39 shows a cross sectional view of the line "W–X" in FIG. 38. As shown in FIG. 39, the memory block includes a plurality of memory cells, and a fifth cell transistor on an end portion of the memory block includes a tenth impurity-diffused region 160, a fifth gate 161, and an eleventh impurity-diffused region 162 formed on the semiconductor substrates 103.

Further, a sixth cell transistor placed in the second end portion of the memory block includes the eleventh impurity-diffused region 162, a sixth gate 163, and a twelfth impurity-diffused region 164 on the semiconductor substrate 103. Also, a seventh cell transistor placed in a third end portion of the memory block includes the twelfth impurity-diffused region 164, a seventh gate 165 and a thirteenth impurity-diffused region 166.

In addition, a fifth metal contact 167 is connected to the tenth impurity-diffused region 160, and is also connected to a first plate line 168 arranged over the tenth impurity-diffused region 160. A second plate line 169 connected to the other memory block is arranged over the eleventh impurity-diffused region 162 and has the same position as the first plate line 168 in the vertical direction.

A fifth capacitor includes a fourth lower electrode 170, a fourth ferroelectric layer 171 and a fifth upper electrode 172 formed over the tenth impurity-diffused region 160. A sixth metal contact 173 is formed between the first plate line 168 and the fifth upper electrode 172. A fifth memory cell includes the fifth cell transistor and the fifth capacitor.

A sixth capacitor includes a fifth lower electrode 174 formed over the eleventh impurity-diffused region 162 and the sixth gate 163, a fifth ferroelectric layer 175 formed on the fifth lower electrode 174, and a sixth upper electrode 176 formed on the fifth ferroelectric layer 175 and over the sixth gate 163. The fifth lower electrode 174 is connected to the eleventh impurity-diffused region 162 by a fourth polysilicon plug 177.

A fifth metal contact 178 is connected to the twelfth impurity-diffused region 164, and a fourth metal wiring 179 is connected to the seventh metal contact 178. An eighth metal contact 180 is formed and connected between the sixth upper electrode 176 and the fourth metal wiring 179.

Note a sixth memory cell includes the sixth cell transistor and the sixth capacitor.

A seventh capacitor includes a sixth lower electrode 181 formed over the seventh gate 165 and the thirteenth impurity-diffused region 166, a sixth ferroelectric layer 182 formed on the sixth lower electrode 181, and a seventh upper electrode 183 formed on the sixth ferroelectric layer 182 and over the seventh gate 165. The sixth lower electrode 181 is connected to the thirteenth impurity-diffused region 166 by a fifth polysilicon plug 184, and a ninth metal contact 185 is formed and connected between the seventh upper electrode 183 and the fourth metal wiring 179.

A seventh memory cell includes a seventh cell transistor and a seventh capacitor.

In this structure, the distance "L" between the fifth upper electrode 172 and the sixth upper electrode 176 is larger than the distance "M" between the sixth upper electrode 176 and the seventh upper electrode 183. This difference is caused by the fifth upper electrode 172 being offset from the fifth gate 161 in a horizontal direction. The distance "M" is same as the distance between other memory capacitors respectively placed in an adjacent location in the same memory block.

Because of the micro loading effect, the fifth upper electrode 172 is formed smaller in size compared with the sixth upper electrode 176, the seventh upper electrode 183 and other upper electrodes in the same memory block. Because of the different size of the fifth upper electrode 172, the fifth capacitor may have deteriorated characteristics compared to other memory capacitors.

Further, a block selecting transistor in the block selecting section is provided in the end portion of the memory cell block. The capacitors are provided in an even interval in the memory cell block, except in the end portion of the memory cell block (where a capacitor is not provided). Therefore, in the end portion of the memory cell block, the periodicity of the memory cells is not maintained, and thus the distance between the capacitors is larger than that of capacitors in a normal area because of the length of the block selecting transistor.

Further, if the periodicity of the capacitors is not maintained, the characteristics of the capacitor in the end portions of the memory block may deteriorate. This deterioration is caused by a change of resist dimension for the change of the cross sectional shape of the upper electrode or lower electrode, or the increase of the distance between the capacitors by a micro loading effect during the fabricating process.

In addition, in the end portion of memory block which has relatively large opening area of resist, the amount of etching is larger than the amount of etching in other portions of memory cells.

Further, in the memory cell neighboring the plate line, the periodicity of the memory cell is not maintained. Therefore, the characteristic of the memory in the memory cell neighboring the plate line may also be damaged. In addition, a high density of memory cells may be reduced by using metal wiring for connecting the impurity-diffused regions.

The above deterioration of the memory capacitor adjacent to the block selecting transistor or plate line does not meet the demands for a more integrated and reliable semiconductor memory. Further, the above scale increase of memory cell occurs from using the first metal contact wire between the impurity-diffused regions with an isolation region between them and does not meet the demands for a more integrated and reliable semiconductor memory.

SUMMARY OF THE INVENTION

The present invention provides a novel semiconductor memory device including a memory cell block with a plurality of transistors formed in series on a semiconductor substrate. The memory transistors have first and second impurity-diffused regions and gates respectively formed therebetween, a plurality of memory cells each having a lower electrode connected to the first impurity-diffused region, a ferroelectric film formed on the lower electrode, and a first upper electrode formed on the ferroelectric film and being connected to the second impurity-diffused region. Also included is a block selecting transistor formed on the semiconductor substrate and being connected to one end of the memory cell block. A second upper electrode is also formed adjoined to the block selecting transistor and is disconnected from the first upper electrode of the memory cell. The present invention also relates to a method of fabricating the novel semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 40(A) shows a step of fabricating of a conventional Series connected TC unit type ferroelectric RAM; and FIG. 40(B) shows a cross sectional view of the line "Y–Z" in FIG. 40(A).

DETAILED DESCRIPTION OF THE INVENTION

Figure 1:
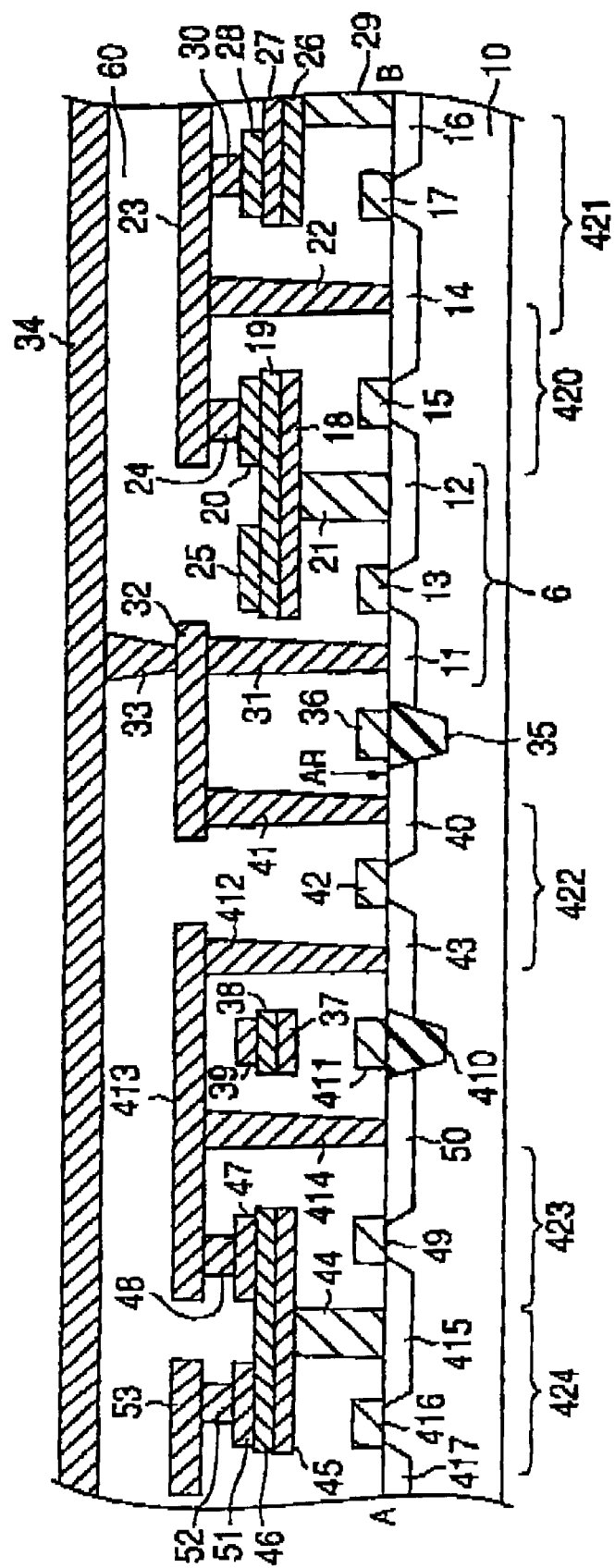
FIG. 1 shows a cross sectional view of the line "A–B" in FIG. 2 of the first embodiment for a structure neighboring the block selecting transistor of a semiconductor memory according to the present invention.

Various embodiments of the present invention will now be described with reference to the accompanying drawings, in which the same or similar reference numerals are applied to the same or similar parts and elements throughout the drawings, and the description of the same or similar parts and elements will be omitted or simplified. Note also that the drawings are not drawn to scale and in particular that the layer thickness are arbitrarily drawn for facilitating the reading of the drawings.

An object of the present invention is to solve the above-noted and other problems. Another object of the invention is to provide high-density non-volatile semiconductor memories and a method of manufacturing such memories.

Figure 2:
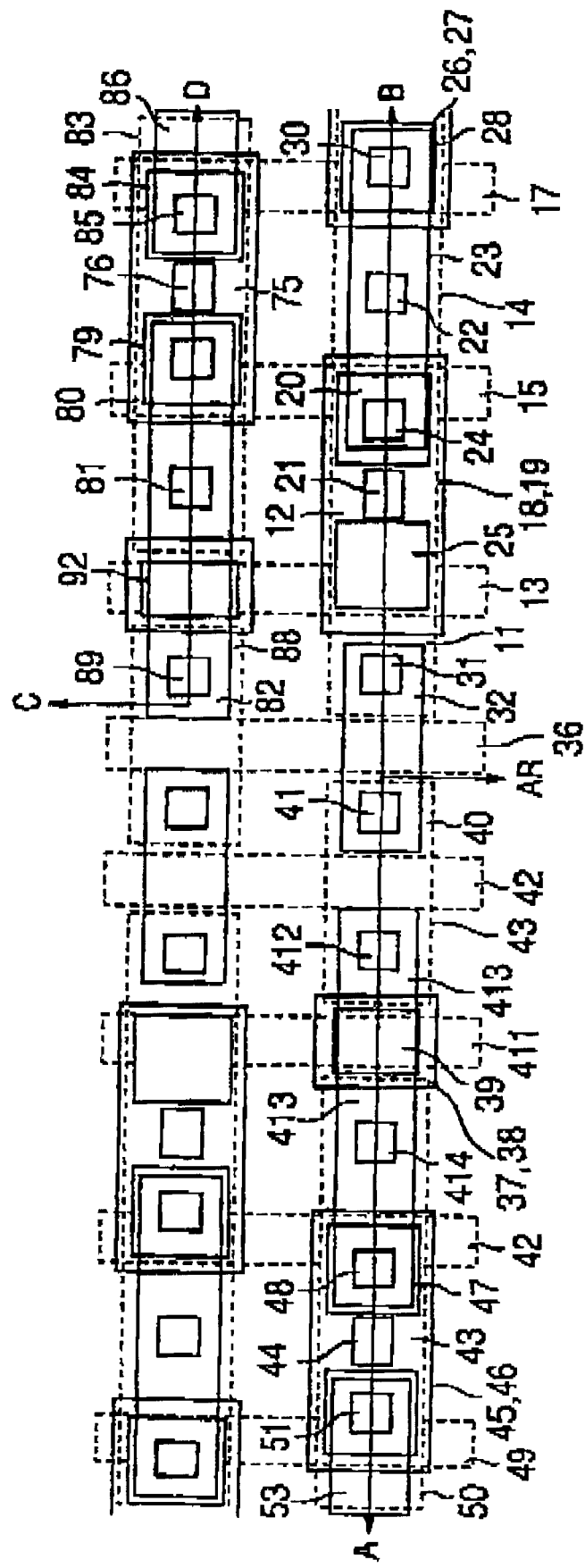
FIG. 2 shows an over view of a first embodiment for a structure neighboring the block selecting transistor of a semiconductor memory according to the present invention.

The first embodiment according to the present invention will now be described with reference to FIGS. 1 to 7 and 34. In more detail, FIG. 1 is a cross sectional view of the line "A–B" in FIG. 2 of a semiconductor memory having ferroelectric capacitors, and FIG. 2 is an overview of the semiconductor memory shown in FIG. 1. Further, FIG. 3 is an over view of the right portion of the semiconductor memory shown in FIG. 2, and FIG. 4 is a sectional view of the line "AR–BR" in FIG. 3.

Figure 3:
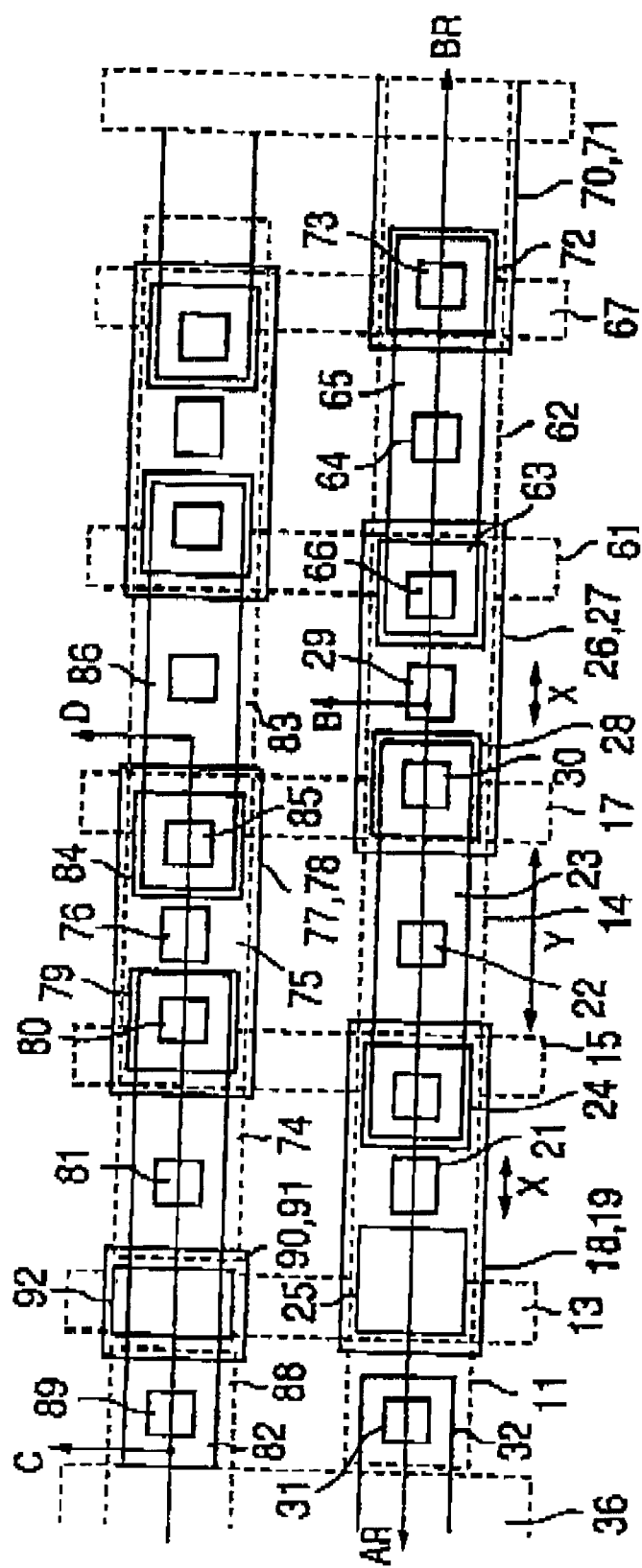
FIG. 3 shows an over view of the right side of FIG. 2.
Figure 4:
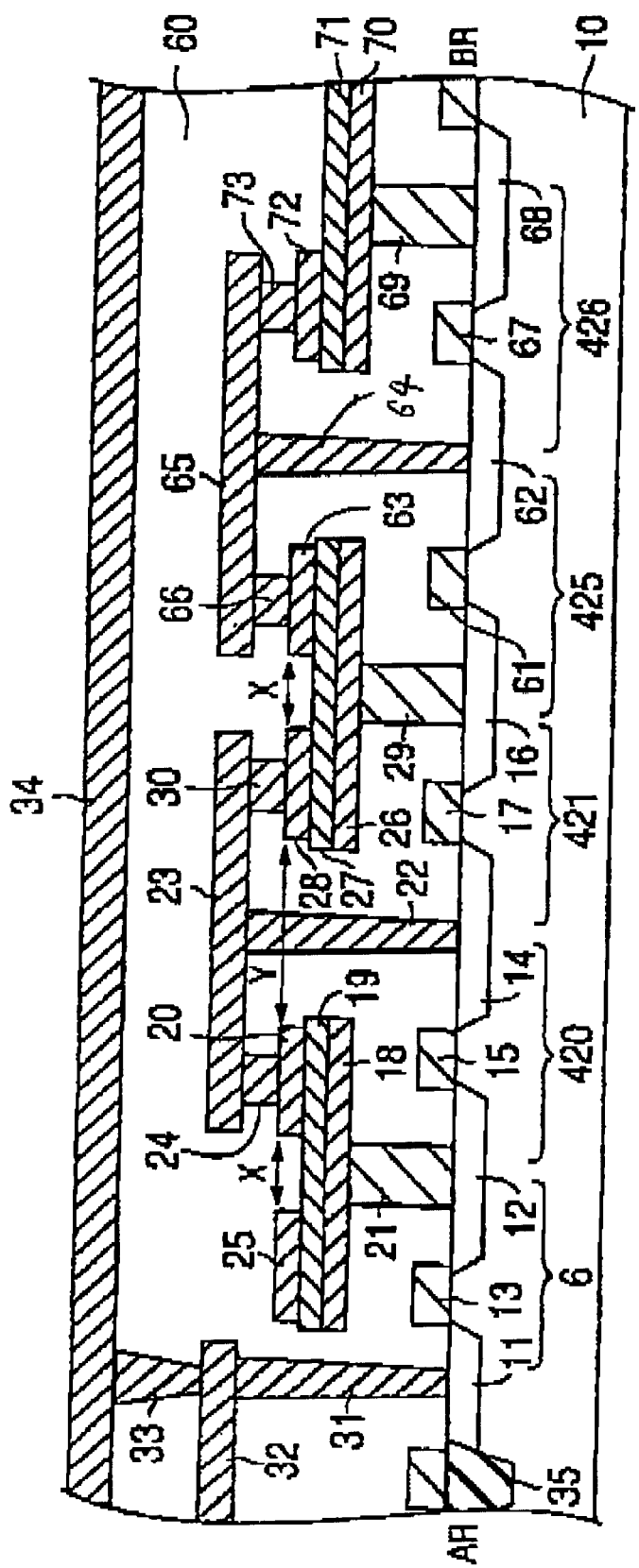
FIG. 4 shows a cross sectional view of the line "AR–BR" in FIG. 3.

Further, each element shown in FIG. 1 corresponds to the position of each element in the lateral direction in FIG. 2, and each element shown in FIG. 4 corresponds to the position of each element in the lateral direction in FIG. 3. Note the circuit of this embodiment is also illustrated using the circuit diagram shown in FIG. 34.

Figure 34:
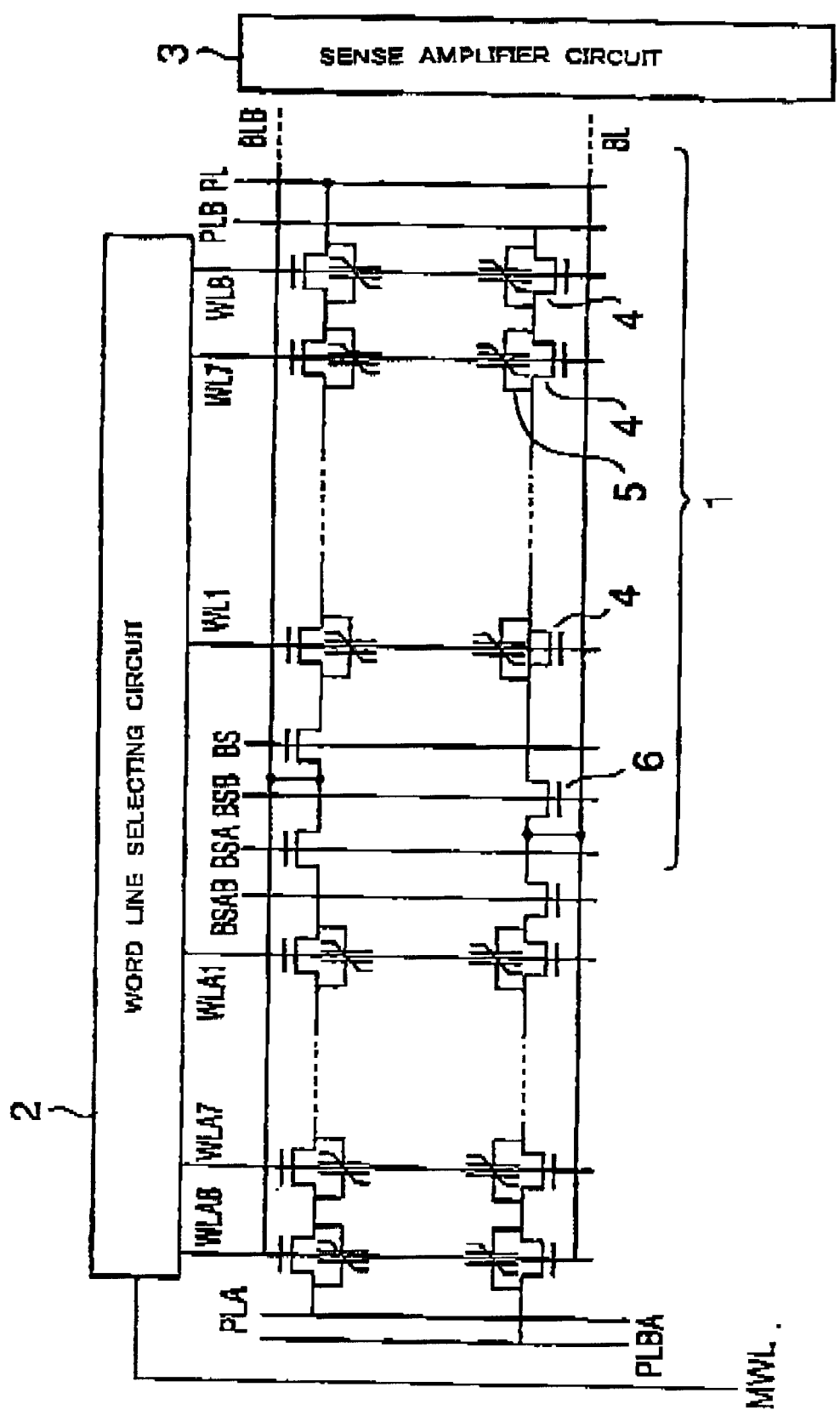
FIG. 34 shows a circuit diagram of a conventional Series connected TC unit type ferroelectric RAM.
Figure 35:
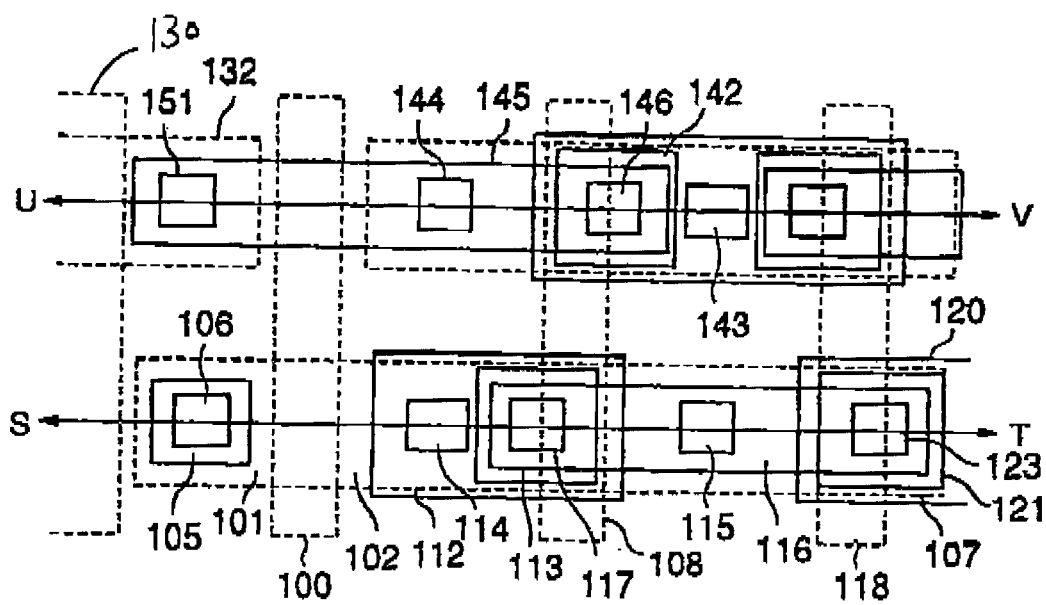
FIG. 35 shows an over view for a structure neighboring the block selecting transistor of a conventional Series connected TC unit type ferroelectric RAM.
Figure 36:
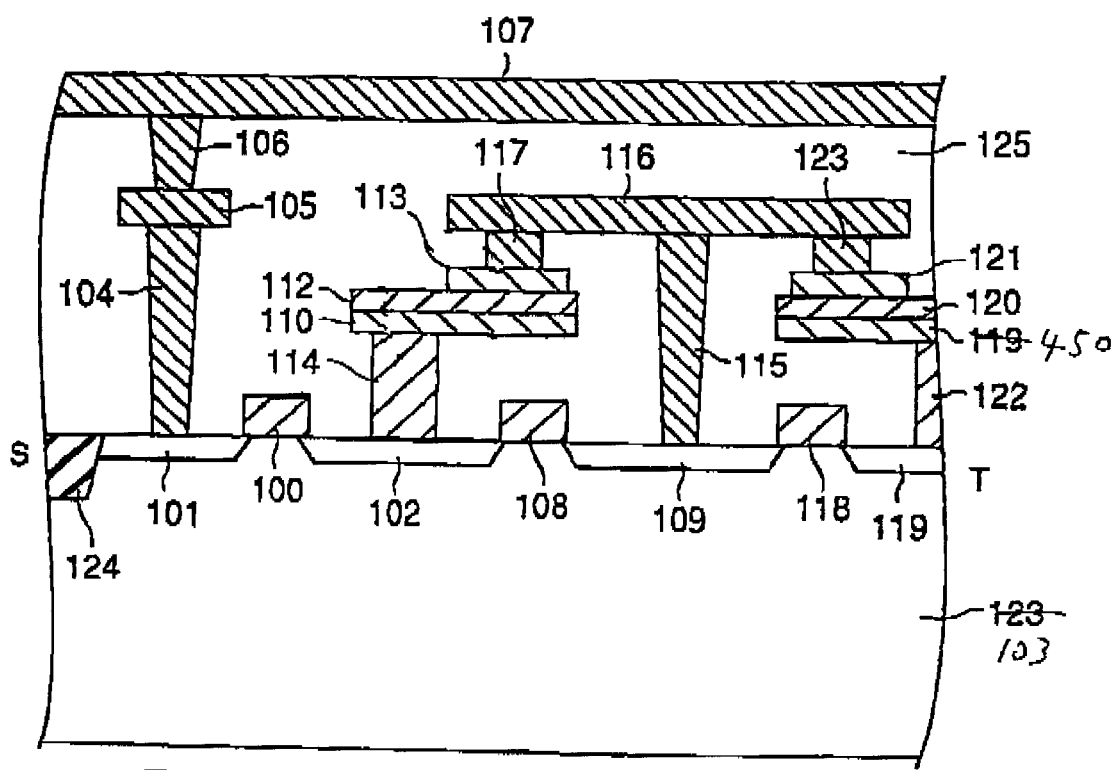
FIG. 36 shows a cross sectional view of the line "S–T" in FIG. 35.
Figure 37:
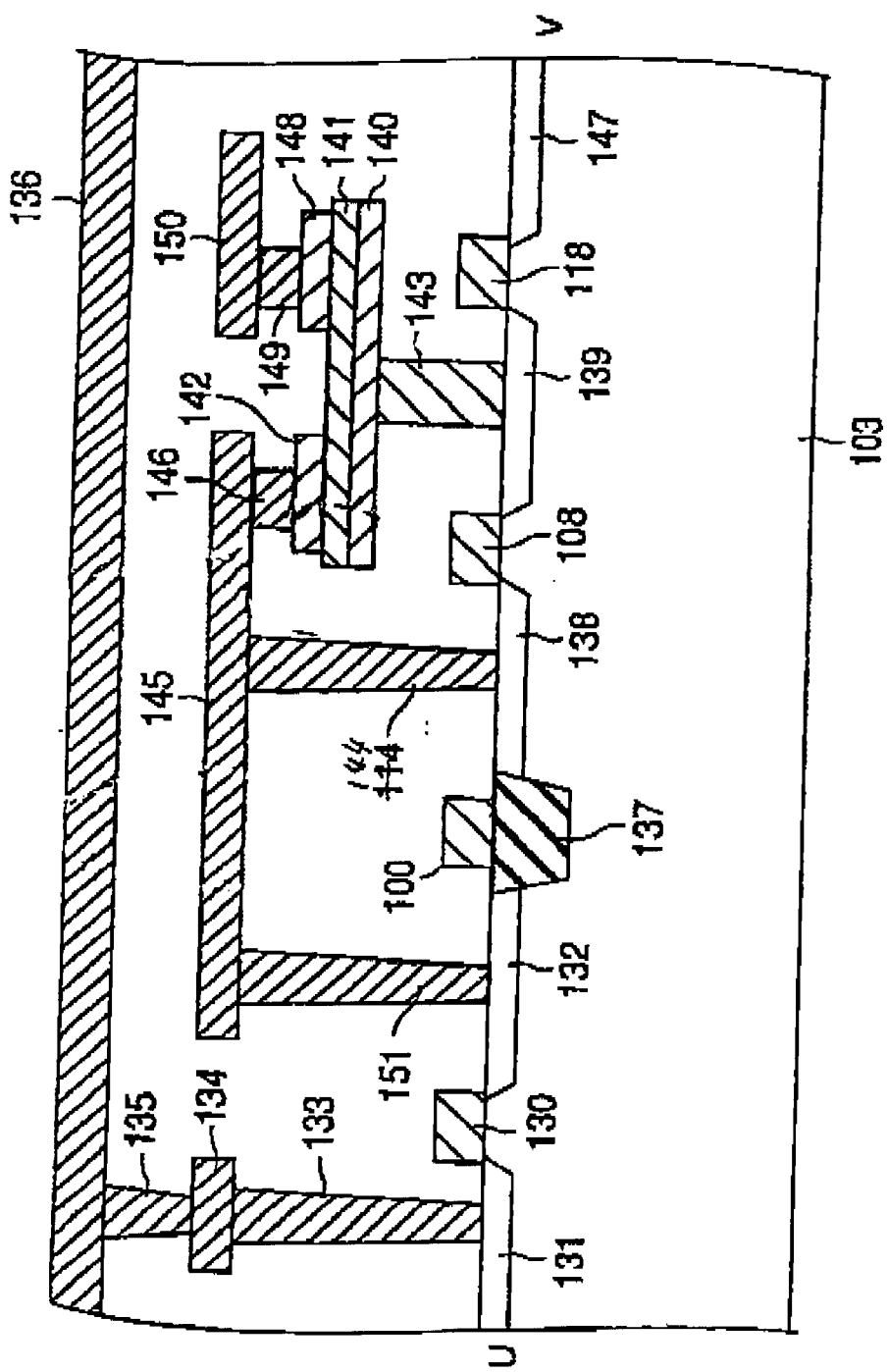
FIG. 37 shows a cross sectional view of the line "U–V" in FIG. 35.
Figure 38:
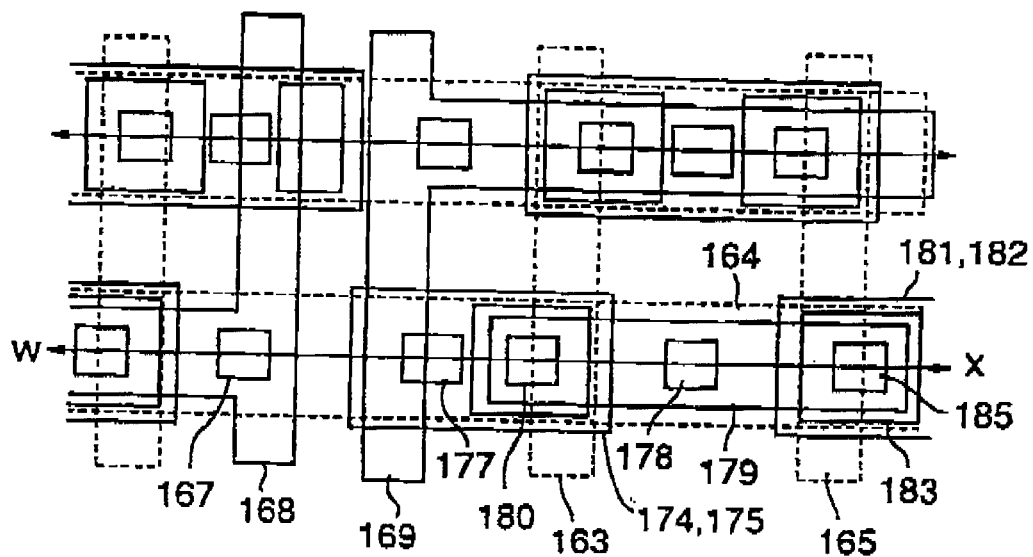
FIG. 38 shows an over view for a structure neighboring a plate line of a conventional Series connected TC unit type ferroelectric RAM.
Figure 39:
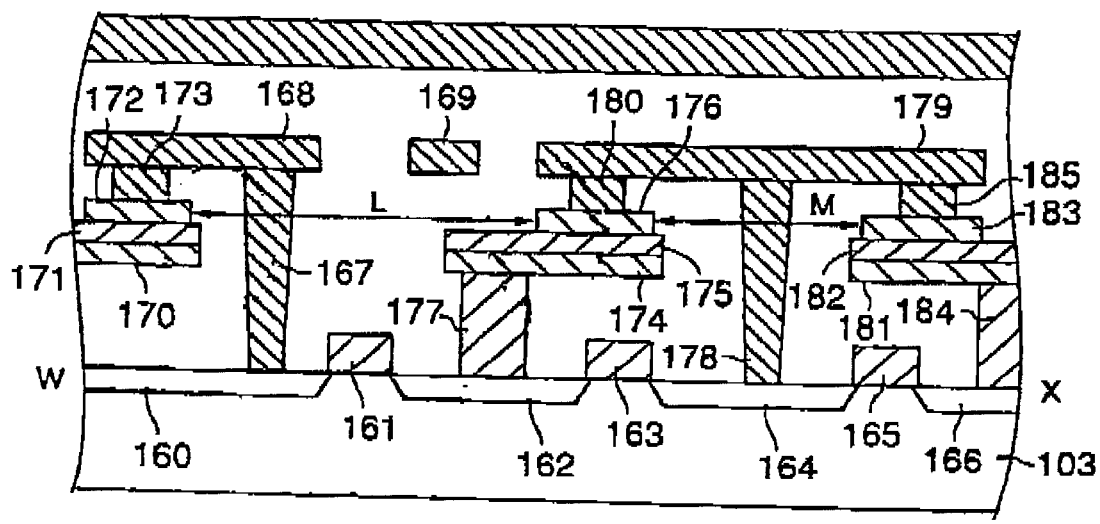
FIG. 39 shows a cross sectional view of the line "W–X" in FIG. 38.

For example, as shown in FIG. 34, several memory blocks 1 are arranged between a pair of bit lines BL, BLB, a first pair of plate lines PL, PLB, a second pair of plate lines PLA, PLBA, several groups of word lines WL1, WL2, . . . , WL8, WLAI, . . . , WLA8, and several pairs of block select lines BS, BSB, BSA, BSAB.

Each word line is connected to a word line selecting circuit 2, and the word line selecting circuit 2 is connected with a multilevel word line MWL. Further, the pair of bit lines BL, BLB is connected to a sense amplifier circuit 3, and each memory block 1 includes a plurality of cell transistors 4, a same number of ferroelectric capacitors 5 and a block selecting transistor 6.

The number of the cell transistors 4 and the ferroelectric capacitors 5 in one memory block 1 is usually eight or sixteen, however, another number may be selected. Further, each transistor 4 is connected in series in each memory block 1, and each gate of the cell transistors 4 is respectively connected to one of the word lines.

Turning now to FIG. 1, which illustrates a p-type silicon semiconductor substrate 10 and the block selecting transistor 6 including a first impurity-diffused region 11, a second impurity-diffused region 12 and a first gate 13.

Further, a first cell transistor 420 includes the second impurity-diffused region 12, a third impurity-diffused region 14, and a second gate 15. Also, a second cell transistor 421 has the third-impurity diffused region 14, a fourth impurity-diffused region 16, and a third gate 17.

A first capacitor has a first lower electrode 18, a first ferroelectric layer 19, and a first upper electrode 20. The first lower electrode 18 is formed over the first gate 13, the second impurity-diffused region 12 and the second gate 15 and is connected to the second impurity-diffused region 12 via a first polysilicon plug 21.

In addition, a first metal plug 22 is connected to the third impurity-diffusion region 14, and a first metal layer 23 is connected to the first metal plug 22 and the first upper electrode 20 via a first metal contact 24. Further, the first cell transistor 420 and first capacitor perform as a first memory cell.

Also, a first dummy upper electrode 25 is formed on the first ferroelectric layer 19 and over the first gate 13. Note the first dummy upper electrode 25 is not connected to the block selecting transistor 6, the first cell transistor 420 and the second cell transistor 421.

In addition, a second capacitor includes a second lower electrode 26, a second ferroelectric layer 27 and a second upper electrode 28 respectively formed over the third gate 17 and the fourth impurity-diffused region 16. The second lower electrode 26 is connected to the fourth impurity-diffused region 16 via a second polysilicon plug 29, and the second upper electrode 28 is connected to the first metal layer 23 via a second metal contact 30. Further, the second cell transistor 421 and the second capacitor perform as a second memory cell.

In addition, the block selecting transistor 6, the first memory cell, and the second memory cell are included in one memory block. Also, capacitors and cell transistors are arranged repeatedly in the direction of the right side of FIG. 1. The number of the capacitors and the cell transistors is same as the number of the memory cells in one memory block, and the memory block is repeatedly arranged in the same direction in plural number.

Further, a first bit line plug 31 is connected to the first impurity-diffused region 11, a first bit line contact 32 is connected to the first bit line plug 31, and a second bit line plug 33 is connected to the first bit line contact 32. Also, a first bit line 34 is formed over the block selecting transistor 6, the first memory cell, and the second memory cell, and is connected to the second bit line plug 33.

In addition, a first isolation region 35 is formed on the semiconductor substrate 10 and is adjacent to the first impurity-diffused region 11. A passing word line 36 is also formed on the first isolation region 35. Further, a fifth impurity-diffused region 40 is formed on the semiconductor substrate 10, and is adjoined to the opposing side of a side facing the first impurity-diffused region 11 of the first isolation region 35.

A second metal plug 41 is connected to the fifth impurity-diffused region 40 and the first bit line contact 32, a fourth gate 42 is formed on the semiconductor substrate 10 and is adjoined to the fifth impurity-diffused region 40, and a sixth impurity-diffused region 43 is formed on the semiconductor substrate 10 and is adjoined to the fourth gate 42.

Further, a second block selecting transistor 422 includes the fifth impurity-diffused region 40, a sixth impurity-diffused region 43, and the fourth gate 42. A second isolation region 410 is formed on the semiconductor substrate 10 and is adjoined to the sixth impurity-diffused region 43. Also, a second passing word line 411 is formed on the second isolation region 410.

Also, a third lower electrode 37 is formed over the second passing word line 411, a third ferroelectric layer 38 is formed on the third lower electrode 37, and a second dummy electrode 39 is formed on the third ferroelectric layer 38.

In addition, a seventh impurity-diffusion region 50 is formed on the semiconductor substrate and is adjacent to the second isolation region 410. A fifth gate 49 is formed on the semiconductor substrate 10 and is adjacent to the seventh impurity-diffusion region 50, and an eighth impurity-diffusion region 415 is formed on the semiconductor substrate 10 and is adjacent to the fifth gate 49.

A third cell transistor 423 includes the seventh impurity-diffused region 50, the eighth impurity-diffused region 415 and the fifth gate 49. Further, a third polysilicon plug 44 is connected to the eighth impurity-diffused region 415, and a fourth lower electrode 45 is connected to the third polysilicon plug 44 and is formed over the fifth gate 49 and the eighth impurity-diffused region 415.

Also, a fourth ferroelectric layer 46 is formed on the fourth lower electrode 45, and a third upper electrode 47 is formed on the fourth ferroelectric layer 46. The third upper electrode 47 is connected to the fourth metal layer 413 via a third metal contact 48.

A third capacitor includes the fourth lower electrode 45, the fourth ferroelectric layer 46, and the third upper electrode 47. In addition, a sixth gate 416 is formed on the semiconductor substrate 10 and is adjacent to the eighth impurity-diffused region 415, and a ninth impurity-diffused region 417 is formed on the semiconductor substrate 10 and is adjacent to the sixth gate 416. A fourth cell transistor 424 includes the eighth impurity-diffused region 415, the sixth gate 416 and the ninth impurity-diffused region 417.

Further, a fourth upper electrode 51 is formed on the fourth ferroelectric layer 46 and over the sixth gate 416, and a fourth metal contact 52 is formed on the fourth upper electrode 51. A third metal layer 53 is formed over the sixth gate 416 and the ninth impurity-diffused region 417 and is connected to the fourth metal contact 52. The fourth capacitor includes the fourth lower electrode 45, the fourth ferroelectric layer 46, and the fourth upper electrode 51.

Also, a third metal plug 412 is connected to the sixth impurity-diffused region 43 and to the fourth metal layer 413. In addition, a fourth metal plug 414 is connected to the seventh impurity-diffused region 50 and to the fourth metal layer 413.

The second block selecting transistor 422, the third capacitor, the fourth capacitor, the second dummy upper electrode 39, the third cell transistor 423, and the fourth cell transistor 424 are provided in the same memory block. Further, both of the capacitors and cell transistors are repeatedly provided toward the left direction (as discussed previously with respect to the right direction).

The fourth memory cell includes the fourth cell transistor and the fourth capacitor and the third and fourth memory cells are placed in the same block. Further, as noted above, this structure is repeated in the longitudinal direction. Also, the elements described in FIGS. 1 and 2 are covered by an insulating layer 60.

As described above, the first dummy upper electrode 25 is isolated from the first metal layer 23 and every other metal layer. Therefore, the first dummy upper electrode 25 does not function as a capacitor.

In this embodiment, the ferroelectric layer and lower electrode are under the first dummy upper electrode 25. However, it is not necessary to provide such a ferroelectric layer or lower electrode under the dummy upper electrode. That is, the dummy upper electrode may be provided on the insulating layer without the ferroelectric layer or over the lower electrode without the ferroelectric layer or on the ferroelectric layer without the lower electrode.

In addition, the area of the dummy upper electrode may be the same size as the other upper electrode. In other situations, the area of the dummy upper electrode may be smaller or larger than the other upper electrode. If the size of dummy upper electrode is larger than the other upper electrode, the area of the block selection transistor needs to be larger than usual.

In the structure described above, the ferroelectric layer and lower electrode are under the first dummy upper electrode 25, and are commonly used with another neighboring memory cell. However, the ferroelectric layer or the lower electrode under the dummy upper electrode may be independently formed for the dummy upper electrode.

In addition, in FIG. 2, a width of the lower electrodes 18, 26, 45 in their shorter direction is around 1.2 micrometer, for example, and a width of the upper electrodes 20, 28, 47, 51 and the first dummy electrode 25 in their shorter direction is around 1.0 micrometer. Also, a length of the lower electrodes 18, 26, 45 in their longer direction is around 2.2 micrometer, and a length of the upper electrode 20,28,47,51 in their longer direction is around 1.0 micrometer. Further, a length of the first dummy upper electrode 25 in its longer direction is around 0.5 micrometer.

In FIG. 1, a thickness of the lower electrodes 18, 26, 37, 45 is approximately 0.1 micrometer or 0.2 micrometer, for example, and a thickness of the ferroelectric layers 19, 27, 38, 46 is approximately 0.1 micrometer to 0.3 micrometer, for example. Further, a thickness of the upper electrodes 20, 28, 47, 51, the first dummy upper electrode 25 and the second dummy electrode 39 is approximately 0.1 micrometer to 0.2 micrometer, for example.

Also, a thickness of the gates 13, 15, 17, 42, 49, 416 and the passing word lines 36, 411 is around 0.2 micrometer, for example, and a thickness of the polysilicon plugs 21, 29, 44 is around 0.6 micrometer, for example. In addition, a distance from an upper surface of the upper electrodes 20, 28, 47, 51 to a lower surface of the metal layers 23, 32, 53, 413 and the first bit line contact 32 are around 0.5 micrometer, for example. In addition, a thickness of the metal layers 25, 53, 413 and the first bit line contact 32 is around 0.4 micrometer, and a distance from an upper surface of the metal layers 23, 53, 413 and the first bit line contact 32 to a lower surface of the bit line 34 is around 0.5 micrometer, for example.

In general, the area of the upper electrode is smaller than that of the lower electrode or ferroelectric layer. This is because two upper electrodes are formed on one ferroelectric layer and one lower electrode.

Because of the sequence of manufacturing steps, these sizes are predetermined. In the manufacturing process, the upper electrode is etched to be a predetermined shape in an earlier step, and then the ferroelectric layer and the lower electrode are etched to be a predetermined shape. If the sequence of manufacturing step is changed, the upper electrode may be formed larger than the ferroelectric layer or the lower electrode. In this case, one upper electrode may be used for two neighboring memory cells.

Also note the specific features described above are shown as an example, and these features may be changed depending on particular technical specifications.

Turning now to FIGS. 3 and 4, which illustrate the right side of the semiconductor memory shown in FIGS. 1 and 2. As shown, a fifth cell transistor 425 includes the fourth impurity-diffused region 16, a seventh gate 61 and a tenth impurity-diffused region 62 on the semiconductor substrate 10. The seventh gate 61 is adjacent to the fourth impurity diffusion region 16.

Further, a fifth upper electrode 63 is formed on the second ferroelectric layer 27 and over the seventh gate 61. A fifth metal plug 64 is connected to the tenth impurity-diffused region 62, and a fifth metal layer 65 is formed over the fifth upper electrode 63 and the tenth impurity-diffused region 62 and is connected to the fifth metal plug 64. A fifth metal contact 66 is also formed between and connected to the fifth upper electrode 63 and the fifth metal layer 65.

A fifth capacitor includes the second lower electrode 26, the second ferroelectric layer 27, and the fifth upper electrode 63. Further, a fifth memory cell includes the fifth cell transistor 425 and the fifth capacitor.

In addition, a sixth cell transistor 426 includes the tenth impurity-diffused region 62, an eighth gate 67 and an eleventh impurity-diffused region 68 respectively formed on the semiconductor substrate 10. The eighth gate 67 is adjacent to the tenth impurity-diffused region 62, and the eleventh impurity-diffused region 68 is adjacent to the eighth gate 67.

Further, a fourth polysilicon plug 69 is connected to the eleventh impurity-diffused region 68. A fifth lower electrode 70 is connected to the fourth polysilicon plug 69 and is formed over the eighth gate 67 and the eleventh impurity-diffused region 68. In addition, a fifth ferroelectric layer 71 is formed on the fifth lower electrode 70, and a sixth upper electrode 72 is formed on the fifth ferroelectric layer 71 and over the eighth gate 67. A sixth metal contact 72 is formed between and connected to the fifth metal layer 65 and the sixth upper electrode 72.

A sixth capacitor includes the fifth lower electrode 70, the fifth ferroelectric layer 71 and the sixth upper electrode 72, and a sixth memory cell includes the sixth cell transistor 426 and the sixth capacitor.

In the above structure, the distance between the first dummy upper electrode 25 and the first upper electrode 20, and the distance between the second upper electrode 28 and the fifth upper electrode 63 are set to "X". The distance between the first upper electrode 20 and the second upper electrode 28 is set to "Y". Usually, the length "Y" is larger than the length "X", because there is first metal plug 22 between the first upper electrode 20 and the second upper electrode 28. Further, a marginal space is needed for manufacturing the first metal plug 22 between the first lower electrode 18 and the second lower electrode 26.

Figure 5:
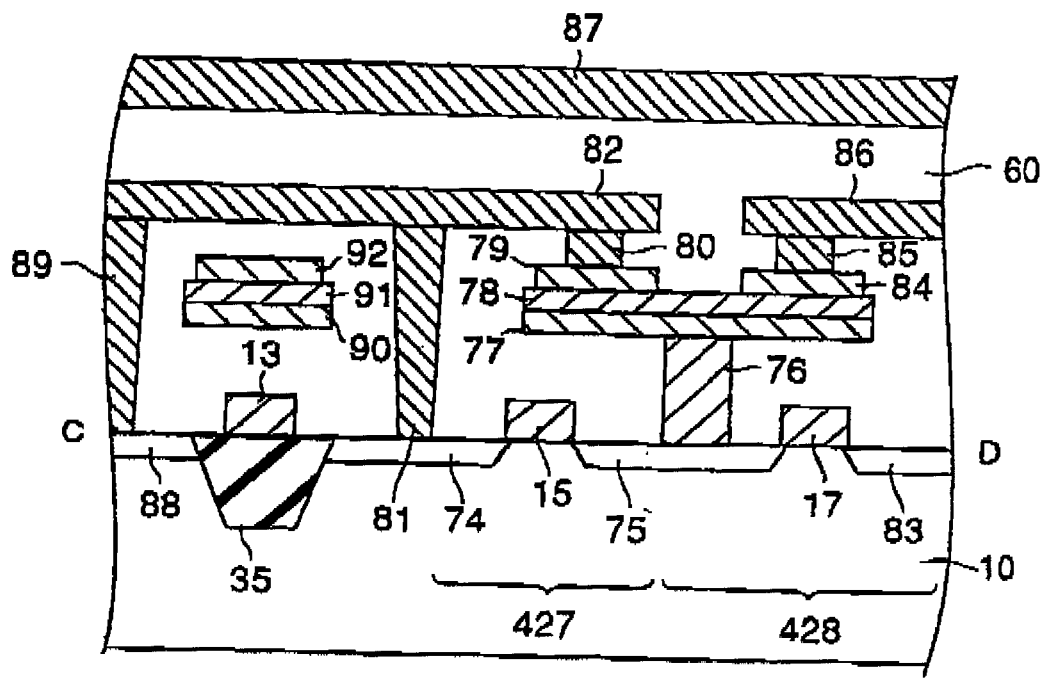
FIG. 5 shows a cross sectional view of the line "C–D" in FIG. 2.

Turning now to FIG. 5, which is a cross sectional view of the semiconductor memory in FIG. 2 as depicted on the line C–D. Each element in FIG. 5 is shown in positions corresponding to the each position in the longitudinal direction shown in FIG. 2. Note, FIG. 5 shows a memory block neighboring in parallel in the longitudinal direction to the memory block shown in FIGS. 1 and 2.

As shown, a seventh cell transistor 427 includes a second gate 15, a twelfth impurity-diffused region 74, and a thirteenth impurity-diffused region 75 respectively formed on the semiconductor substrate 10. The twelfth impurity-diffused region 74 and the thirteenth impurity-diffused region 75 are adjacent to the second gate 15.

Further, a fifth polysilicon plug 76 is connected to the thirteenth impurity-diffused region 75, and a sixth lower electrode 77 is connected to the fifth polysilicon plug 76 and is formed over the second gate 15 and the thirteenth impurity-diffused region 75. A sixth ferroelectric layer 78 is formed on the sixth lower electrode 77, and a seventh upper electrode 79 is formed on the sixth ferroelectric layer 78 and over the second gate 15. Also, a seventh metal contact 80 is formed on the seventh upper electrode 79, and a sixth metal plug 81 is connected to the twelfth impurity-diffused region 74.

Further, a sixth metal layer 82 is formed over the second gate 15 and the twelfth impurity-diffused region 74, and is connected to the seventh metal contact 80 and the fifth metal plug 81. A seventh capacitor includes the sixth lower electrode 77, the sixth ferroelectric layer 78, and the seventh upper electrode 79. Further, a seventh memory cell includes a seventh cell transistor 427 and a seventh capacitor.

Also, an eighth cell transistor 428 has a third gate 17, a thirteen impurity-diffused region 75, and a fourteenth impurity-diffused region 83. The thirteenth impurity-diffused region 75 and the fourteenth impurity-diffused region 83 is adjacent to the third gate 17.

The sixth lower electrode 77 and the sixth ferroelectric layer 78 are formed over the third gate 17. An eighth upper electrode 84 is also formed on the sixth ferroelectric layer 78 and over the third gate 17, and an eighth metal contact 85 is formed on the eighth upper electrode 84. In addition, a seventh metal layer 86 is formed over the third gate 17 and the fourteenth impurity-diffused region 83, and is connected to the eighth metal contact 85. Note, an eighth capacitor includes the sixth lower electrode 77, the sixth ferroelectric layer 78, and the eighth upper electrode 84. Note an eighth memory cell includes the eighth cell transistor 428 and an eighth capacitor.

Further, a second bit line 87 is formed over the sixth metal layer 82 and the seventh metal layer 86. A fifteenth impurity-diffused region 88 is formed on the semiconductor substrate 10 and is adjacent to the first isolation region 35, and a seventh metal plug 89 is connected to the fifteenth impurity-diffused region 88 and the sixth metal layer 82.

Also, a seventh lower electrode 90 is formed over the first isolation region 35, and a seventh ferroelectric layer 91 is formed on the seventh lower electrode 90. A third dummy upper electrode 92 is formed on the seventh ferroelectric layer 91 and is disconnected from other transistors. Further, the elements as described above in connection with FIG. 5 are covered by an insulating layer 60, and the structure is repeated in the longitudinal direction. Also, the sixth metal layer 82 is used for connecting the twelfth impurity-diffused region 74 and the fifteenth impurity-diffused region 88.

In FIG. 1, when the block selecting transistor 6 is selected, the memory block shown in FIG. 1 is selected and is connected to the first bit line 34, and the memory block shown in FIG. 5 is not selected and is disconnected from the second bit line 87.

The procedure for selecting the memory block described above uses the folded bit line formation for selecting a pair of neighboring memory blocks. For example, as shown in FIG. 34, the folded bit line formation includes a pair of complement bit lines respectively connected to neighboring memory blocks in the extending direction of block selection lines which are activated alternatively.

Figure 6:
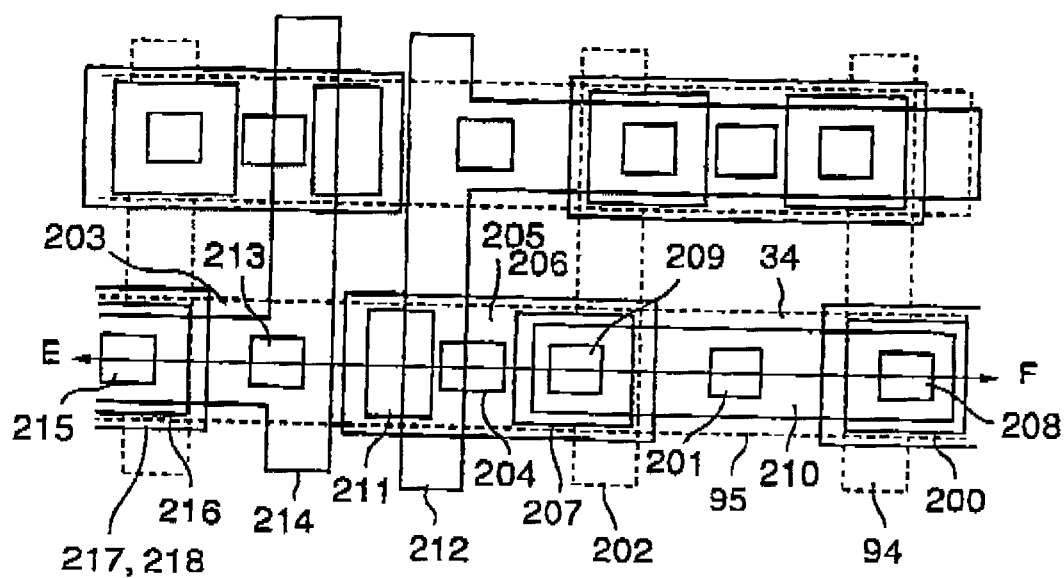
FIG. 6 shows an over view of the first embodiment for a structure neighboring a plate line of a semiconductor memory according to the present invention.
Figure 7:
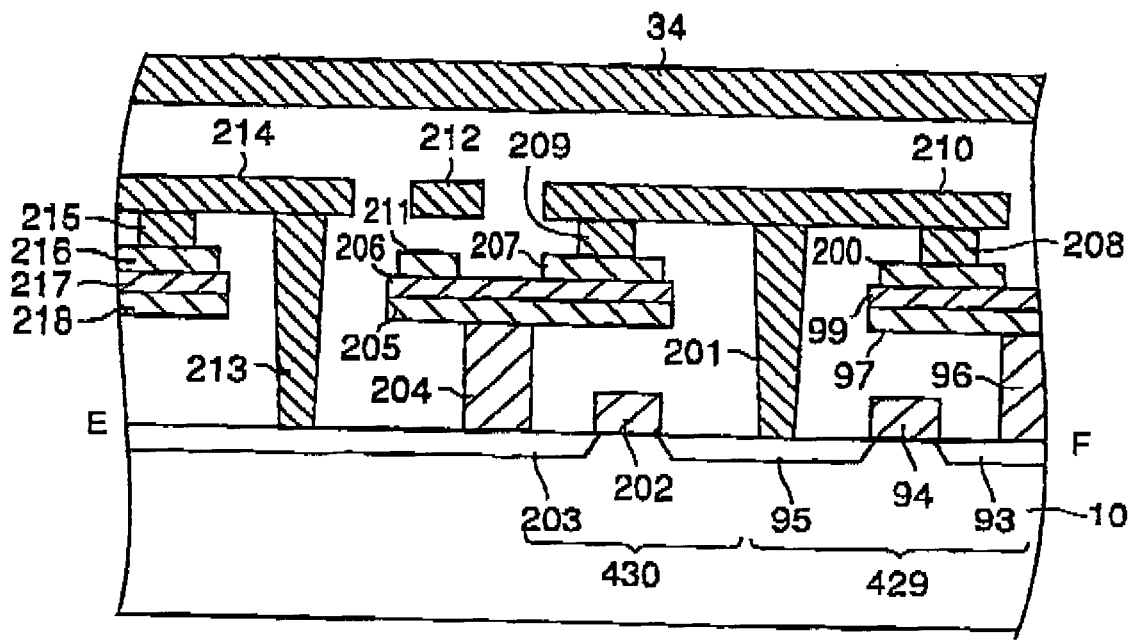
FIG. 7 shows a cross sectional view of the line "E–F" in FIG. 6.

In addition, the structure of the neighboring region around the plate line in FIG. 34 is shown in FIGS. 6 and 7. The top view is shown in FIG. 6 and the sectional view of line "E–F" is shown in FIG. 7. The position of each element in FIG. 7 corresponds to the position in the longitudinal direction of each element in FIG. 6.

As shown, a sixteenth impurity-diffused region 93 is formed on the semiconductor substrate 10, and a ninth gate 94 is formed on the semiconductor substrate 10 and is adjacent to the sixteenth impurity-diffused region 93. A seventeenth impurity-diffused region 95 is formed on the semiconductor substrate 10 and is adjacent to the ninth gate 94. The sixteenth impurity-diffused region 93, the ninth gate 94 and the seventeenth impurity-diffused region 95 form a ninth cell transistor 429.

Further, a sixth polysilicon plug 96 is connected to the sixteenth impurity-diffused region 93, and an eighth lower electrode 97 is connected to the sixth polysilicon plug 96 and is formed over the sixteenth impurity-diffused region 93 and the ninth gate 94. An eighth ferroelectric layer 99 is formed on the eighth lower electrode 97, and a ninth upper electrode 200 is formed on the eighth ferroelectric layer 99 and over the eighth gate 94. A seventh metal plug 201 is also formed on the seventeenth impurity-diffused region 95.

The eighth lower electrode 97, the eighth ferroelectric layer 99, and the ninth upper electrode 200 form a ninth capacitor. Further, the ninth cell transistor 429 and the ninth capacitor form a ninth memory cell.

In addition, a tenth gate 202 is formed on the semiconductor substrate 10 and is adjacent to the seventeenth impurity-diffused region 95, and an eighteenth impurity-diffused region 203 is formed on the semiconductor substrate 10 and is adjacent to the tenth gate 202. A tenth cell transistor 430 includes the seventeenth impurity-diffused region 95, the ninth gate 202 and the eighteenth impurity-diffused region 203.

Also, a ninth lower electrode 205 is connected to the seventh polysilicon plug 204 and is formed over the tenth gate 202 and the eighteenth impurity-diffused region 203. A ninth ferroelectric layer 206 is formed on the ninth lower electrode 205, and a tenth upper electrode 207 is formed on the ninth ferroelectric layer 206 and over the tenth gate 202.

A ninth metal contact 208 is connected to the ninth upper electrode 200, and a tenth metal contact 209 is connected to the tenth upper electrode 207. An eighth metal layer 210 is connected to the seventh metal plug 201, the ninth metal contact 208 and the tenth metal contact 209. Further, a fourth dummy upper electrode 211 is formed on the ninth ferroelectric layer 206.

A tenth capacitor includes the ninth lower electrode 205, the ninth ferroelectric layer 206, and the tenth upper electrode 207. Further, a tenth memory cell includes the tenth cell transistor 430 and the tenth capacitor.

In addition, a first plate line 212 is used for selecting the memory cell block positioned in an upper direction of the memory cell block on the "E–F" line shown in FIG. 6. The first plate line 212 is formed over the fourth dummy upper electrode 211 and is positioned in the same level of the eighth metal layer 210 in a vertical direction in FIG. 7. Also, an eighth metal plug 213 is connected to the eighteenth impurity diffused region 203.

A second plate line 214 is connected to the eighth metal plug 213 (hereinafter the area around the eighth metal contact 213 is called a plate line contact area). Further, an eleventh metal contact 215 is connected to the second plate line 214, an eleventh upper electrode 216 is connected to the eleventh metal contact 215, and a tenth ferroelectric layer 217 is formed under the eleventh upper electrode 216. A tenth lower electrode 218 is also formed under the tenth ferroelectric layer 217.

In addition, note that by providing the fourth dummy upper electrode 211, the space between the upper electrodes in the plate line contact area becomes smaller, so the increase of space when an upper electrode is not in the plate line contact area is prevented. Therefore, the upper electrode performing circuit operation is not located in the outer side of the memory block and a regular distance between the upper electrodes is maintained in every portion in the memory blocks.

Further, the memory block positioned on the line of "A–B" in FIG. 2 and the memory block positioned on the line of "C–D" in FIG. 2 are formed as a folded bit line manner in each memory cell block.

Also, the first gate 13 performs a block selecting gate of the memory cell block positioned on the "A–B" line. The first passing word line 36 performs a selecting gate of the memory cell block positioned on the "C–D" line. Further, the first gate 13 performs a passing gate of the memory cell block positioned on "C–D", and the first passing word line 36 performs a passing gate of memory cell block positioned on "A–B".

In addition, the first bit line contact 32 is used for connecting the impurity-diffused regions 11, 40 of the element region positioned on both sides of the first passing word line 36. The memory cell blocks formed in two steps toward the longitudinal direction are shown in FIG. 2.

As discussed above, each memory cell block includes eight or sixteen memory cells and transistors, for example. In addition, the pattern shown in FIG. 2 is repeated eight or sixteen times.

Further, the lower electrode is made from multi-layered platinum layers formed on a Ti layer, and a thickness of the platinum layer is around 100 nanometers, for example. The lower electrode may be formed as Pt layers on a silicon layer or metal layer. In addition, an Ir layer or $IrO_2$ layer may be used as the lower electrode, and a stacked layer structure of Ti layer, TiN layer, and Pt layer may be used as a lower electrode, Further, each SrRuO layer, Ru layer, RuO layer may be used as a lower electrode.

A composite layer such as SrBiTaO or PbZrTiO, e.g., PZT, (i.e., $Pb(ZrXTi_{1-x})O_3$ is used as the ferroelectric layer, and thickness of the PZT layer is around 150 nanometers, for example. A composite layer of BaSrTiO may also be used as the ferroelectric layer. Further, $BaTiO_3$, $LiNbO_3$, $K_3Li_2Nb_5O_{15}$ may be used as the ferroelectric layer. Namely, an oxidized ferroelectric layer having characteristics of ion bonding may be used as the ferroelectric layer.

In addition, a platinum layer may be used as the upper electrode with a thickness of the Pt layer being around 20 nanometers, for example. A metal layer, (e.g., A1 layer) or a Silicon layer may be deposited on the Pt layer as the upper electrode. In addition, Ir, $IrO_2$ may also be used as the upper electrode, and each of the SrRuO, Ru, RuO layer is used as the upper electrode. Also, a BPSG layer or TEOS layer is used as the mid-layer insulating film, and an A1 layer may be used as the metal layer.

Further, the dielectric polarization of a capacitor increases and the characteristics of a memory improve by expanding the area of the upper electrode. Note the area of the upper electrode is determined by each specification.

In the first embodiment, the dummy capacitor which is disconnected from every cell unit, every impurity diffusion region, and every gate electrode is provided on the block selecting transistor and under the plate line. By providing the dummy capacitor, each capacitor used for a memory cell is not provided on the most outer position. Thus, according to the first embodiment, the characteristics of the memory capacitor are improved by using a dummy upper electrode adjacent to the block selecting transistor or the plate line.

The second preferred embodiment according to the present invention will now be described with reference to FIGS. 8 to 13. In this embodiment, the lower electrode of the memory capacitor is used as a connecting layer for impurity-diffused regions separated by an isolation region.

Figure 8:
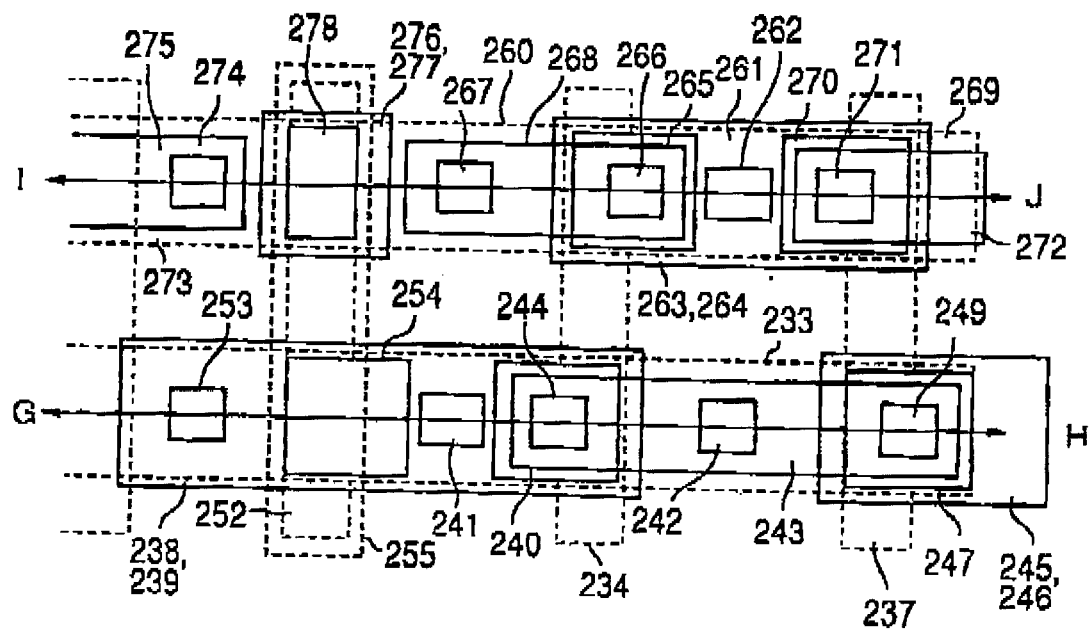
FIG. 8 shows an over view of a second embodiment for a structure neighboring the block selecting transistor of a semiconductor memory according to the present invention.
Figure 9:
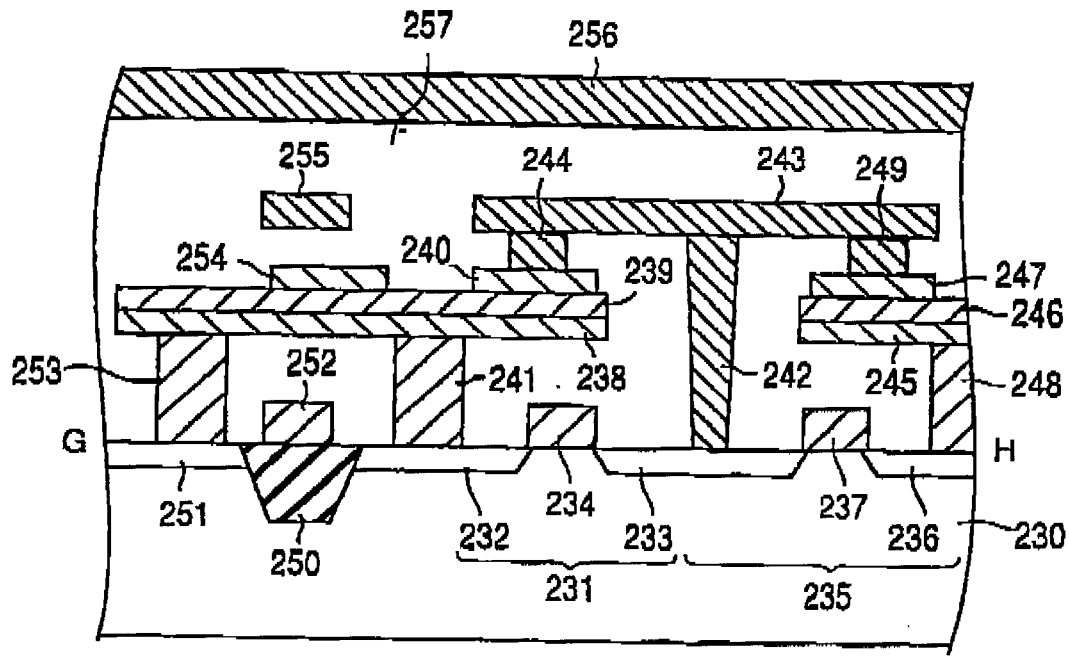
FIG. 9 shows a cross sectional view of the line "G–H" in FIG. 8.

FIG. 8 shows a plane view of this embodiment, with cross section of the line "G–H" being shown in FIG. 9. Further, each element in FIG. 9 is provided in the same positions corresponding to the elements positioned in the lateral direction in FIG. 8. As shown in FIG. 9, a semiconductor substrate 230, which is p-type silicon, is provided. A first cell transistor 231 has a first impurity-diffused region 232, a second impurity-diffused region 233 and a first gate 234. A second cell transistor 235 includes the second impurity-diffused region 233, a third impurity-diffused region 236 and a second gate 237.

Further, a first capacitor has a first lower electrode 238, a first ferroelectric layer 239, and a first upper electrode 240 formed over the first gate 234. The first lower electrode 238 is formed over the first impurity-diffused region 232 and the first gate 234 and is connected to the first impurity-diffused region 232 via a first polysilicon plug 241. A first metal plug 242 is connected to the second impurity-diffused region 233, and a first metal layer 243 is connected to the first metal plug 242. The first metal layer 43 is also connected to the first upper electrode 240 via a first metal contact 244.

Note a first memory cell includes the first cell transistor 231 and the first capacitor.

A second capacitor includes a second lower electrode 245, a second ferroelectric layer 246, and a second upper electrode 247 respectively formed over the second gate 237. The second lower electrode 245 is formed over the third impurity-diffused region 236 and is connected to the third impurity-diffused region 236 via a second polysilicon plug 248. Further, a second metal contact 249 is connected between the first metal layer 243 and the second upper electrode 247.

Note, a second memory cell includes the second cell transistor 235 and the second capacitor.

In addition, an isolation region 250 is formed on the semiconductor substrate 230 and is adjacent to the first impurity-diffused region 232. A fourth impurity-diffused region 251 is formed on the semiconductor substrate 230 and is adjacent to the isolation region 250. A passing word line 252 is formed on the isolation region 250, and a third polysilicon plug 253 is formed between the fourth impurity-diffused region 251 and the first lower electrode 238.

Further, a first dummy upper electrode 254 is formed on the first ferroelectric layer 239 and over the passing word line 252. Note that the first dummy upper electrode 254 is not connected to any cell transistors. A first layer word line 255 is also formed over the first dummy upper electrode 254.

In addition, the first cell transistor 231, the first capacitor, the second cell transistor 235, and the second capacitor are included in one memory block, and a first bit line 256 is formed over the memory block. Further, the structure above-described structure is repeated in the longitudinal direction in FIG. 9, and each element shown in FIG. 9 is covered by an insulating layer 257.

Also, the first lower electrode 238 is connected between the first impurity-diffused region 232 and the fourth impurity-diffused region 251. Therefore, there is no need to provide a metal layer to connect the first impurity-diffused region 232 and the fourth impurity-diffused region 251. By using this structure, a multi layered word line as the first folded bit lines 255 is provided on the isolation region.

In this structure, an increase in area of the block selecting transistor is prevented by using the lower electrode for connection of the impurity-diffused regions. Further, the resistance of the lower electrode of the capacitor for connection of the impurity-diffused regions is preferably set lower than one tenth of a resistance of the block selecting transistor during on state. Namely, the lower electrode has a resistance below several hundreds ohm. The series resistance of the lower electrodes is preferably around several hundreds ohm. In general, the resistance of a normal lower electrode is around 10K ohm.

Further, in this embodiment, the dummy upper electrode may be optionally omitted, and a width of the multi layered bit lines has a smaller size rather than the width of the dummy upper electrode in their shorter direction. Note also the block selecting transistor is omitted in FIG. 9, which is actually located in a left outer portion of the fourth impurity-diffused region 251.

As described above, the first dummy upper electrode 254 is isolated from the cell transistor. Therefore, the first dummy upper electrode 254 does not perform as a capacitor.
A marked-up copy of the changes made in this amendment is attached.

Also, in this embodiment, the ferroelectric layer and the lower electrode are under the dummy upper electrode. However, it is not necessary to provide such a ferroelectric layer or a lower electrode under the dummy upper electrode. That is, the dummy upper electrode may be provided on the insulating layer, over the lower electrode without the ferroelectric layer, or on the ferroelectric layer without the lower electrode. Further, the area of the dummy upper electrode may be the same size as the upper electrode, or may be smaller or larger than the area of the upper electrode.

In the above-described structure, the ferroelectric layer and lower electrode under the dummy upper electrode are commonly used respectively with other neighboring memory cells. However, the ferroelectric layer or the lower electrode under the dummy upper electrode may be independently formed for the dummy upper electrode. In addition, each size of the elements described above may be the same size as corresponding elements in the first embodiment.

Figure 10:
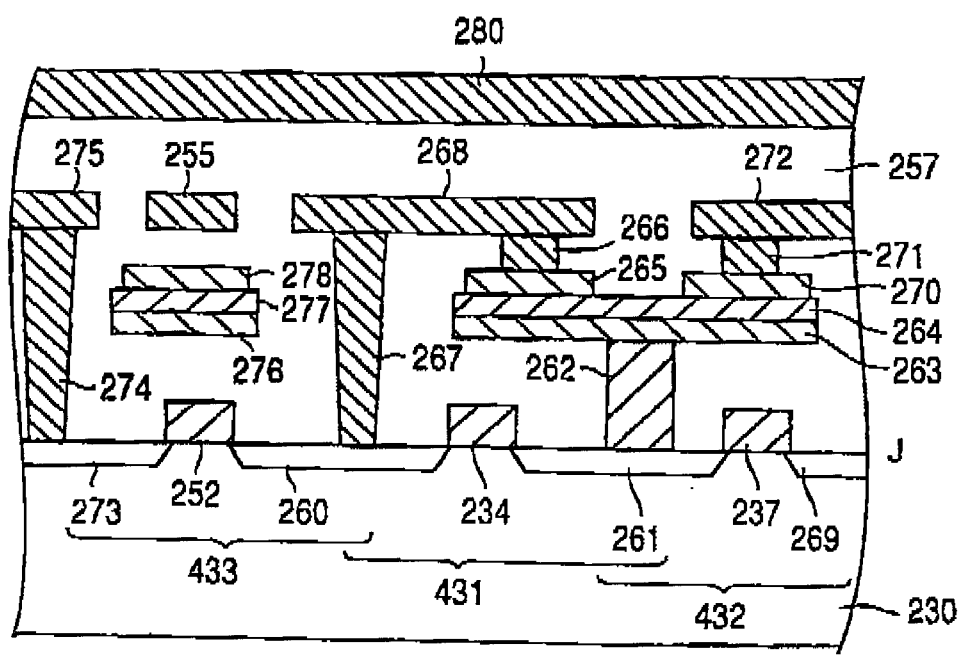
FIG. 10 shows a cross sectional view of the line "I–J" in FIG. 8.

Turning now to FIG. 10, which is a cross sectional view of the semiconductor memory in FIG. 8 as depicted on line "I–J". Further, each element is positioned similarly to the elements in FIG. 8 in a lateral direction.

As shown, a third cell transistor 431 includes the first gate 234, a fifth impurity-diffusion region 260, and a sixth impurity-diffused region 261. The fifth impurity-diffused region 260 and the sixth impurity diffused region 261 are adjacent to the first gate 234. A fourth polysilicon plug 262 is connected to the sixth impurity diffused region 261. In addition, a third lower electrode 263 is connected to the fourth polysilicon plug 262 and is formed over the first gate 234 and the sixth impurity-diffused region 261. Further, a third ferroelectric layer 264 is formed on the third lower electrode 263, and a third upper electrode 265 is formed on the third ferroelectric layer 264 and over the first gate 34.

A third metal contact 266 is also formed on the third upper electrode 265, and a second metal plug 267 is connected to the fifth impurity-diffused region 260. A second metal layer 268 is formed over the first gate 234 and the fifth impurity-diffused region 260, and is connected to the third metal contact 266 and the second metal plug 267.

Further, a third capacitor includes the third lower electrode 263, the third ferroelectric layer 264, and the third upper electrode 265. Also, a third memory cell includes a third cell transistor 431 and a third capacitor, and a fourth cell transistor 432 has a second gate 237, the sixth impurity-diffused region 261, and a seventh impurity diffused region 269. Note the seventh impurity-diffused region 269 is adjacent to the second gate 237.

In additions, a fourth upper electrode 270 is formed over the second gate 237, and a fourth metal contact 271 to formed on the fourth upper electrode 270. Also, a third metal layer 272 is formed over the second gate 237 and the seventh impurity-diffused region 269, and is connected to the fourth metal contact 271. A fourth capacitor includes the third lower electrodes 263, the third ferroelectric layer 264, and the fourth upper electrode 270, and a fourth memory cell includes a fourth cell transistor 432 and a fourth capacitor.

In addition, a block selecting transistor 433 includes the fifth impurity-diffused region 260, the passing word line 252 and a ninth impurity-diffused region 273. Note the ninth impurity-diffused region 273 is formed on the semiconductor substrate 230 and is adjacent to the passing word line 252.

Also, a third metal plug 274 is connected to the ninth impurity-diffused region 273, a fourth metal layer 275 is connected to the third metal plug 274, and a fourth lower electrode 276 is formed over the third gate 252. Also, a fourth ferroelectric layer 277 is formed on the fourth lower electrode 276, a second dummy upper electrode 278 is formed on the fourth ferroelectric layer 277, and a first layer word line 255 is formed over the second dumpy upper electrode 278.

Note, the third memory cell, the fourth memory cell, and the block selecting transistor are included in same memory block. Further, a second bit line 280 is formed on the memory cell block, and every element described above is connection with FIG. 10 is covered by an insulating layer 257.

In addition, the elements shown in FIG. 10 an repeated is a longitudinal direction of the memory block in FIG. 8, and the pattern of the neighboring area of the plate line is the same as the first embodiment and thus a description is omitted. When the block selecting transistor 433 shown in FIG. 10 is selected, the memory block shown in FIG. 10 is selected and is connected to the second bit line 280, and the memory block shows in FIG. 9 not selected and is disconnected from first bit line 256.

By using the lower electrode wire to connect element regions an both sides of the passing gate, to area of block selecting transistor is not determined by the design rule of the first metal layer. Further, there is a passing word line over the lower electrode wire. Also, by using a COP structure, a plug may be provided in the capacitor area. Therefore, reduction of the plug area is possible and high density is achieved.

In the procedure of the selecting memory block described above, the folded bit line formation is used for selecting a pair of neighboring memory blocks. As discussed about, and as shown in FIG. 34, the folded bit line formation is the manner in which a pair of complement bit lines is respectively connected to each neighboring memory block in an extending direction of block selection lines and is activated alternately.

In this embodiment, there is no need to increase the number of wires of the multi-layered word line, nor is there is no need to increase the area of block selecting transistor. Further, according to the second embodiment, a direct connection is provided by using the lower electrode between the impurity-diffused regions combining the isolation region. The direct connection in this embodiment markedly reduces the space around the isolation region for placing the mull-layered bit line.

Figure 11:
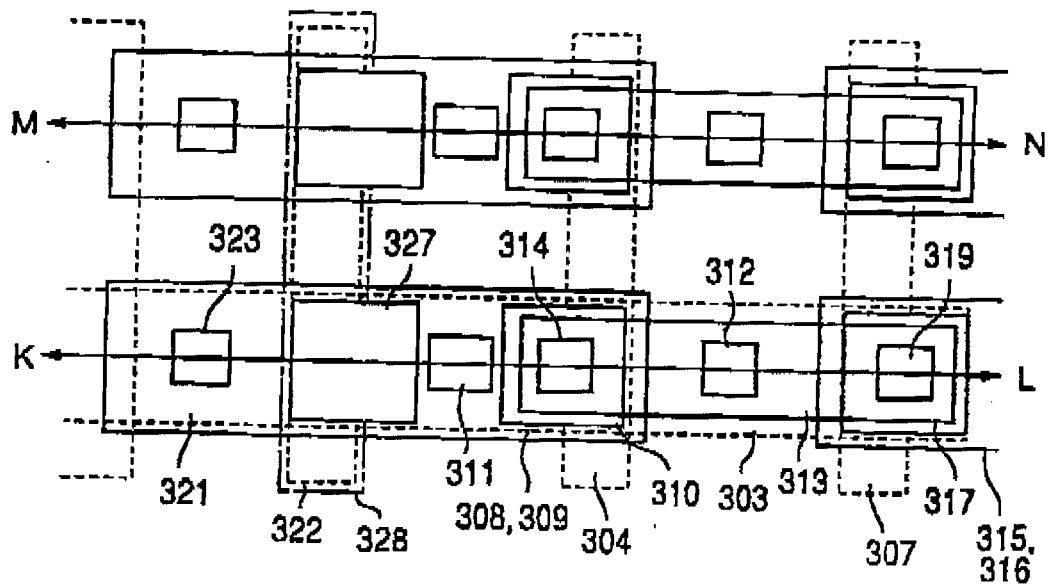
FIG. 11 shows an over view of a third embodiment for a structure neighboring the block selecting transistor of a semiconductor memory according to the present invention.

Turning now to the third preferred embodiment according to the present invention, which will be described with reference to FIGS. 11 to 14. In FIG. 11, the cross section of the line "K-L" is shown in FIG. 12, and each element in FIG. 12 is provided in the same position corresponding to the elements positioned in the lateral direction in FIG. 11.

Figure 12:
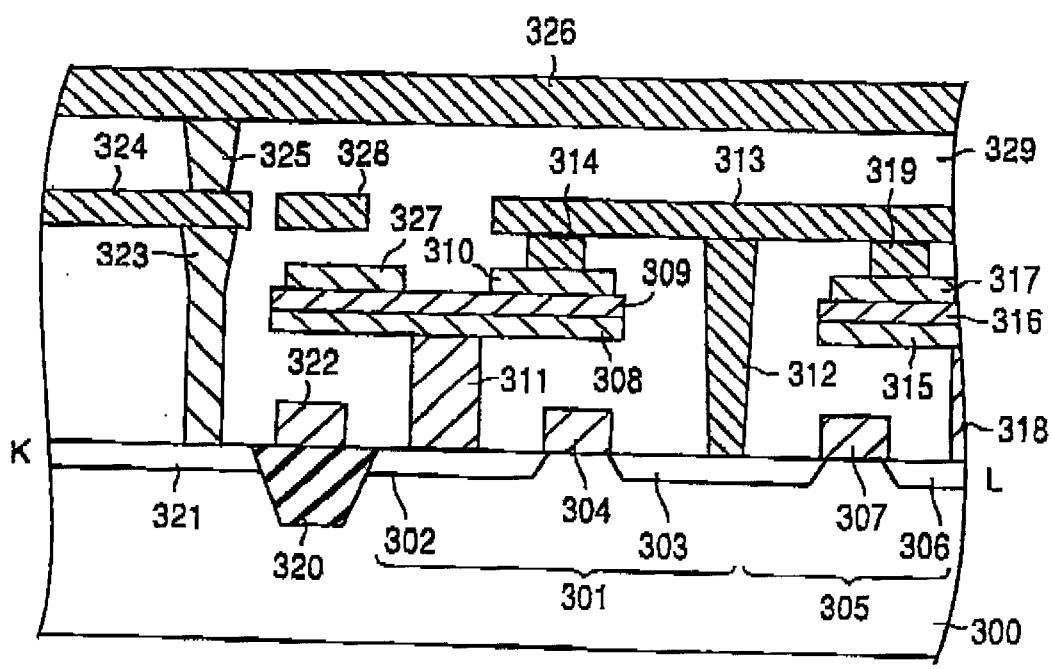
FIG. 12 shows a cross sectional view of the line "K–L" in FIG. 11.

As shown in FIG. 12, a semiconductor substrate 300, which is p-type silicon, is provided. A first cell transistor 301 has a first impurity-diffused region 302, a second impurity-diffused region 303 and a first gate 304. A second cell transistor 305 has the second impurity-diffused region 303, the third impurity-diffused region 306 and a second gate 307.

Further, a first capacitor includes a first lower electrode 308, a first ferroelectric layer 309, and a first upper electrode 310 formed over the first gate 304. The first lower electrode 308 is also formed over the first impurity-diffused region 302 and the first gate 304, and is connected to the first impurity-diffused region 302 via a first polysilicon plug 311. In addition, a first metal plug 312 is connected to the second impurity-diffused region 303, a first metal layer 313 is connected to the first metal plug 312, and the first metal layer 313 is connected, to the first tipper electrode 310 via a first metal contact 314.

Note the first cell transistor 301 and the first capacitor form a first memory cell.

Also, a second capacitor has a second lower electrode 315, a second ferroelectric layer 316, and a second upper electrode 317 respectively formed over the third impurity-diffused region 306 and the second gate 307. The second lower electrode 315 is formed over the third impurity-diffused region 306 and the second gate 307, and is connected to the third impurity-diffused region 306 via a second polysilicon plug 318. In addition, a second metal contact 319 is connected between the first metal layer 313 and the second upper electrode 317.

Note, the second cell transistor 305 and a second capacitor form a second memory cell.

Also, an isolation region 320 is formed on the semiconductor substrate 300 and is adjacent to the first impurity-diffused region 302. A fourth impurity-diffused region 321 is formed on the semiconductor substrate 300 and is adjacent to the isolation region 320. Further, a passing word line 322 is formed on the isolation region 320.

As shown, a second metal plug 323 is connected to the fourth impurity-diffused region 321, a second metal layer 324 is connected to the second metal plug 323, and a bit line contact 325 is connected between the second metal layer 324 and a bit line 326. In addition, a first dummy upper electrode 327 is formed on the first ferroelectric layer 309 and over the passing word line 322. Note the first dummy upper electrode 327 is not connected to any memory transistors. Further, a first layer word line 328 is formed over the first dummy upper electrode 327.

Also, the first layer word line 328 has a narrower width rather than the dummy upper electrode, and the first memory cell and the second memory cell are included is same memory block. The bit line 326 is also formed over the memory cell block. Further, the structure described in FIG. 12 is repeated in a longitudinal direction of the memory block, and each element shown in FIG. 12 is covered by an insulating layer 329. The block selecting transistor is also omitted in FIG. 12, which is located in a left outer portion of the fourth impurity-diffused region 321.

As described above, the first dummy upper electrode 327 is isolated from the first meal layer 313 and the second metal layer 324. Therefore, the first dummy upper electrode 327 does not perform as a capacitor.

Further, is this embodiment the ferroelectric layer and lower electrode are under the first dummy upper electrode. However, it is not necessary to provide the ferroelectric layer or lower electrode under the dummy upper electrode. That is, the dummy upper electrode may be provided on the insulating layer, on the lower electrode without the ferroelectric layer, or on the ferroelectric layer without the lower electrode.

In addition, the area of dummy upper electrode may be the same size as the other upper electrodes or may be smaller or larger than the other upper electrodes. If the size of the dummy upper electrode is larger than the other tipper electrodes, the area of the block selecting transistor needs to be larger than usual.

In the above-described structure, the ferroelectric layer and the lower electrode under the dummy upper electrode are commonly used respectively with other neighboring memory cells. However, the ferroelectric layer or the lower electrode under the dummy upper electrode can be independently formed for dummy upper electrode (as discussed above).

In addition, each size of the elements described above may be the same size as the corresponding elements in the first embodiment. Further, the semiconductor memory shown in FIG. 11, as depicted on line "M-N", is the same as the semiconductor memory shown in FIG. 12 as a cross sectional view. Namely, in the neighboring memory block in the word line extending direction, there is the same structure between them.

Figure 13:
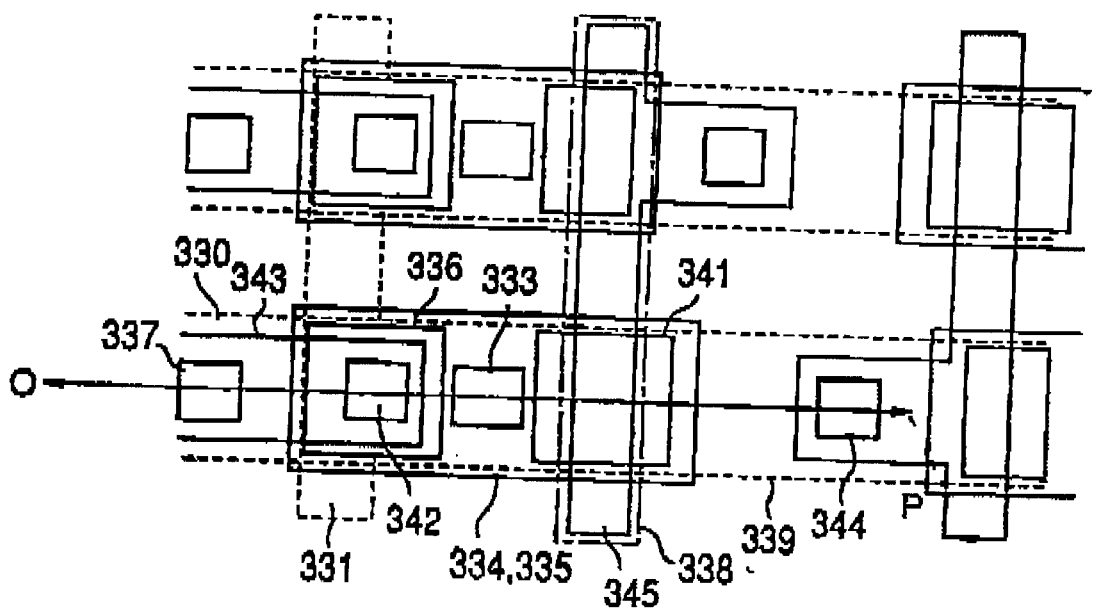
FIG. 13 shows an over view of the third embodiment for a structure neighboring a plate line of a semiconductor memory according to the present invention.
Figure 14:
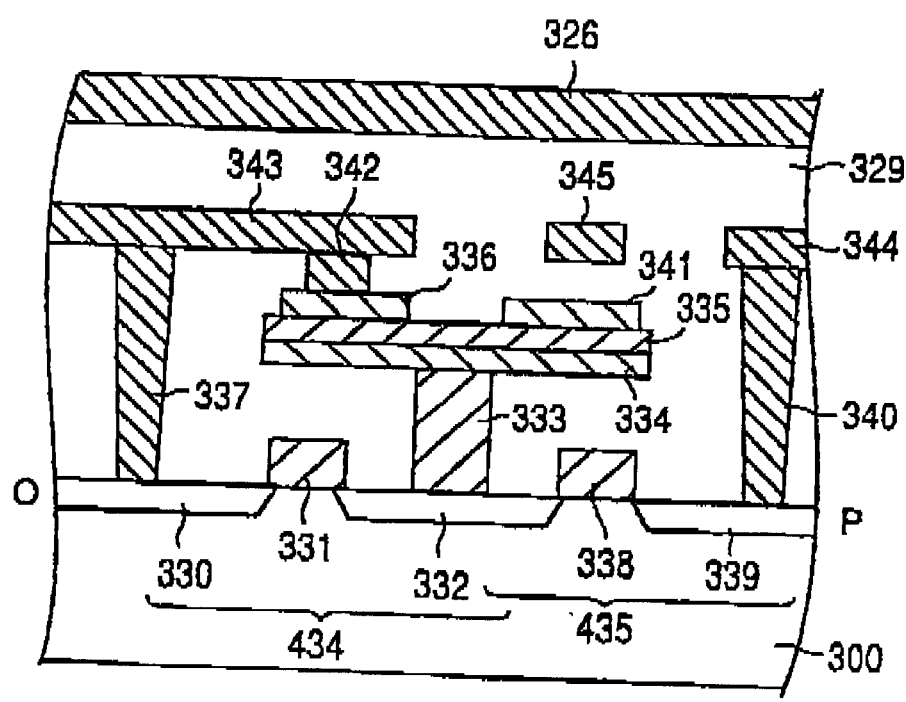
FIG. 14 shows a cross sectional view of the line "O–P" in FIG. 13.

In addition, the structure of the neighboring region around the plate line is FIG. 34 adapted to this embodiment is shown in FIGS. 13 and 14. The top view is shown in FIG. 13 and the sectional view of line "O-P" in FIG. 13 is shown in FIG. 14. Each element in FIG. 14 positioned in the lateral direction corresponds to each element position is lateral direction is FIG. 13.

As shown, a fifth impurity-diffusion region 330 is formed on the semiconductor substrate 300, and a thud gate 331 is formed on the semiconductor substrate 300 and is adjacent to the fifth impurity-diffused region 330. Further, a sixth impurity-diffused region 332 is formed on the semiconductor substrate 300 and is adjacent to the third gate 331. Note, the fifth impurity-diffused region 330, the third gate 331 and the sixth impurity-diffused region 332 form a third cell transistor 434.

In addition, a third polysilicon plug 333 is connected to the sixth impurity-diffused region 332, and a third lower electrode 334 is connected to the third polysilicon plug 333 and is formed over the sixth impurity-diffused region 332 and the third gate 331. Also, a third ferroelectric layer 335 is formed on the third lower electrode 334, a third upper electrode 336 is formed on the third ferroelectric layer 335 and over the third gate 331, and a third metal plug 337 is formed on the fifth impurity-diffused region 330. The third lower electrode 334, the third ferroelectric layer 335, and the third upper electrode 336 form a third capacitor.

Note, the third cell transistor 434 and the third capacitor form a third memory cell.

Further, a fourth gate 338 is formed on the semiconductor substrate 300 and is adjacent to the sixth impurity-diffused region 332. A seventh impurity-diffused region 339 is formed on the semiconductor substrate 300 and is adjacent to the fourth gate 338. Note a fourth cell transistor 435 includes the sixth impurity-diffused region 332, the fourth gate 338, and the seventh impurity-diffused region 339.

In addition, a fourth metal plug 340 is connected to the seventh impurity diffused region 339, and a second dummy upper electrode 341 is formed on the third ferroelectric layer 335 and over the fourth gate 338. A third metal contact 342 is also connected to the third upper electrode 335, and a third metal layer 343 is connected to the third metal plug 337 and the third metal contact 342. Further, a first plate line 344 is formed on the fourth metal plug 340, and a second plate line 345 for another memory block is formed over the second dummy upper electrode 341 and is positioned in the same level of the third metal layer 343 and the first plate line 344 in a vertical direction.

By providing the second dummy upper electrode 341, the space between each upper electrode neighboring the plate line becomes smaller, so the increase of space caused by no upper electrode neighboring the plate line is prevented. Therefore, the upper electrode performing the circuit operation is not located in the most outer side of memory block and a regular distance between upper electrodes is maintained in every portion.

According to the third embodiment, the characteristics of the memory capacitor are improved by using the dummy upper electrode adjacent to the block selecting transistor or the plate line.

The fourth preferred embodiment according to the present invention will now be described with reference to FIGS. 15 to 22, and relates to a method of fabricating a semiconductor memory device according to the first embodiment. In more detail, FIGS. 15 to 22 correspond to the portion on the line "AR-B" in FIG. 1, and each element shown in FIGS. 15 to FIGS. 22 are positioned in a corresponding location as in FIG. 1.

Figure 15:
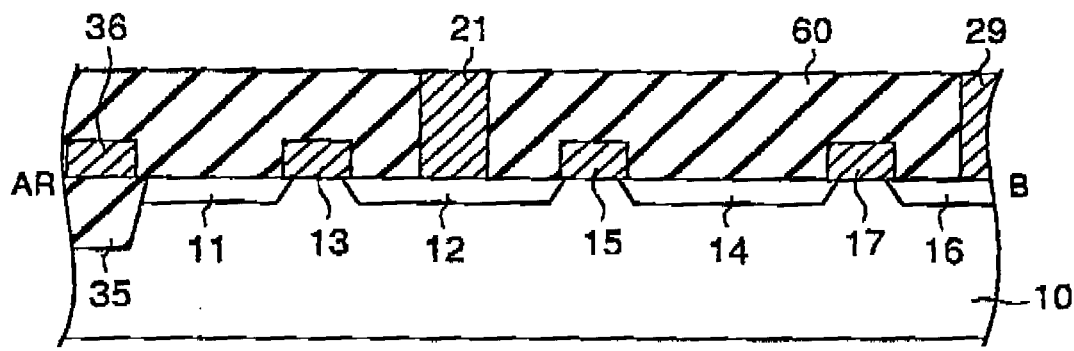
FIGS. 15 to 22 are cross sectional views illustrating a method of fabricating a semiconductor memory according to a fourth embodiment of the present invention.

As shown in FIG. 15, the first isolation region 35, the first to fourth impurity-diffused regions 11,12,14,16, the first to third gate 13,15,17, the passing word line 36, the insulating layer 60, and the first and second polysilicon plug 21,29 are farmed in sequence.

The trench having around a 0.3 micrometer depth is formed in the semiconductor substrate to form the isolation region 35. In the next step, an SiO$_2$ layer is deposited on the entire surface of the semiconductor substrate by using a mixture gas of TEOS gas and ozone gas according to the vapor growth method. After these fabricating steps, an element isolation layer including the SiO$_2$ layer is filled into the trench end the isolation region is formed.

Then, the first to the third gate electrodes 13,15,17 are formed on the semiconductor substrate. Further, there are gate insulating films between the first to the third gate electrodes and the semiconductor substrate, but they are omitted is each figure. Next, the first to the fourth impurity diffusion region 11,12,14,16 for the source and drain regions are formed and the MOS transistors are also formed.

Figure 16:
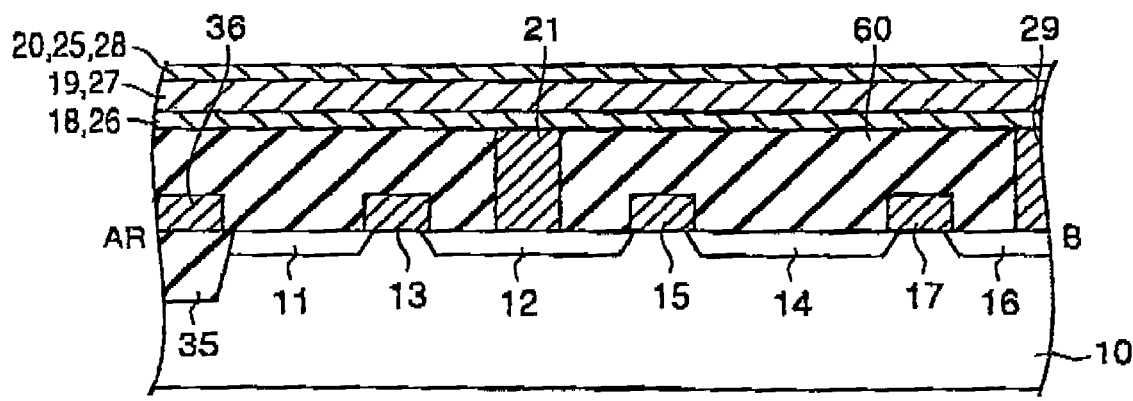

Then, as shown in FIG. 16, the lower electrodes 18,26, ferroelectric layers 19,27, upper electrodes 20,28 and the dummy upper electrode 25 are formed on the insulating layer 60, and the first and second polysilicon plugs 21,29 are formed in sequence. Namely, after the insulating layer 60 is deposited on the entire surface of the semiconductor surface, the surface of the semiconductor substrate is flattened by using the CMP method. After this step, a Ti/Pt layer for the lower electrode of the capacitor, ferroelectric PZT layer 19,27, and Pt layer for the upper electrode 20,28 or the dummy upper electrode 25 of the capacitor is deposited on the entire surface of the semiconductor substrate. Then, after the ferroelectric layer is deposited or the Pt layer is deposited or the photoelectric layer, the ferroelectric layer is annealed tend crystallized.

Figure 17:
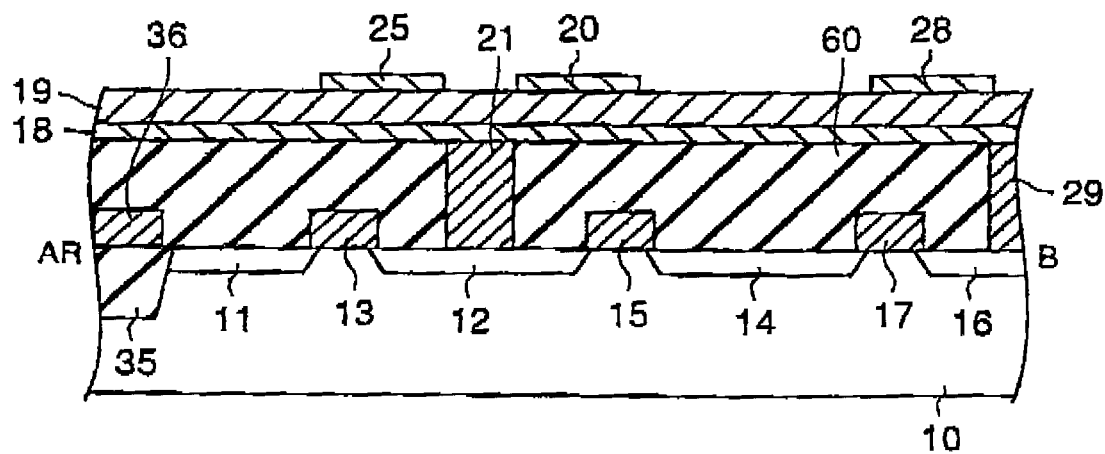

Then, as shown in FIG. 17, the first upper electrode 20, the first dummy upper electrode 25, and the second upper electrode 28 are formed by respectively using resists in the etching method. Namely, the upper electrode layer is only left on the portion of the ferroelectric layer or the dummy upper electrode to be formed.

Figure 18:
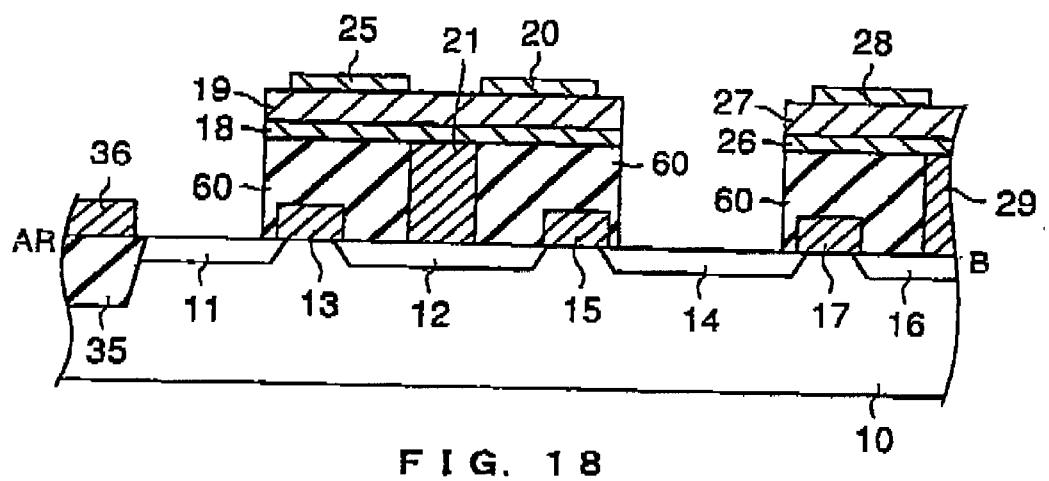
Figure 19:
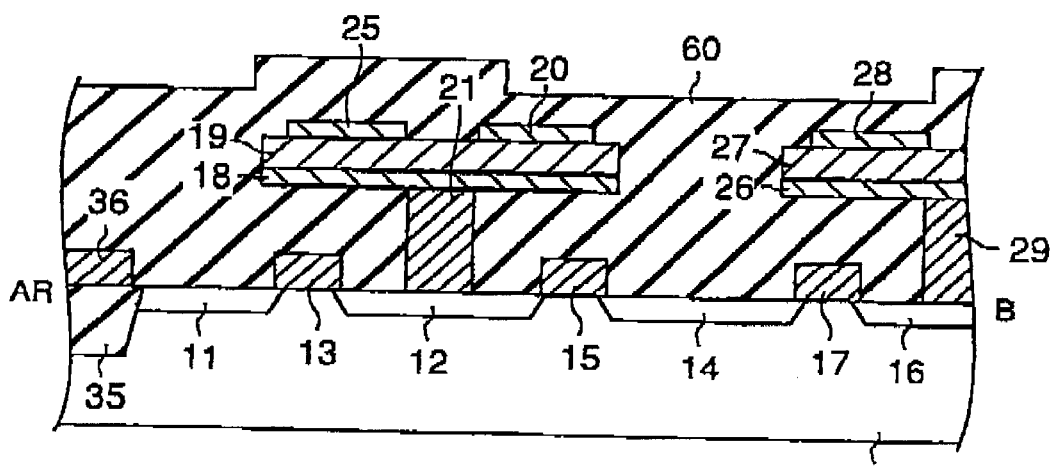

Then, as shown in FIG. 18, the first ferroelectric layer 19, the second ferroelectric layer 27, the first lower electrode 18, and the second lower electrode 26 are respectively formed by etching. Next, the insulating layer 60 except under the first lower electrode 18 and the second lower electrode 26 is removed by etching. Then, as shown in FIG. 19, the insulating layer 60 is deposited over the entire surface of the semiconductor substrate. The surface of the insulating layer 60 is then flattened by the CMP method.

Figure 20:
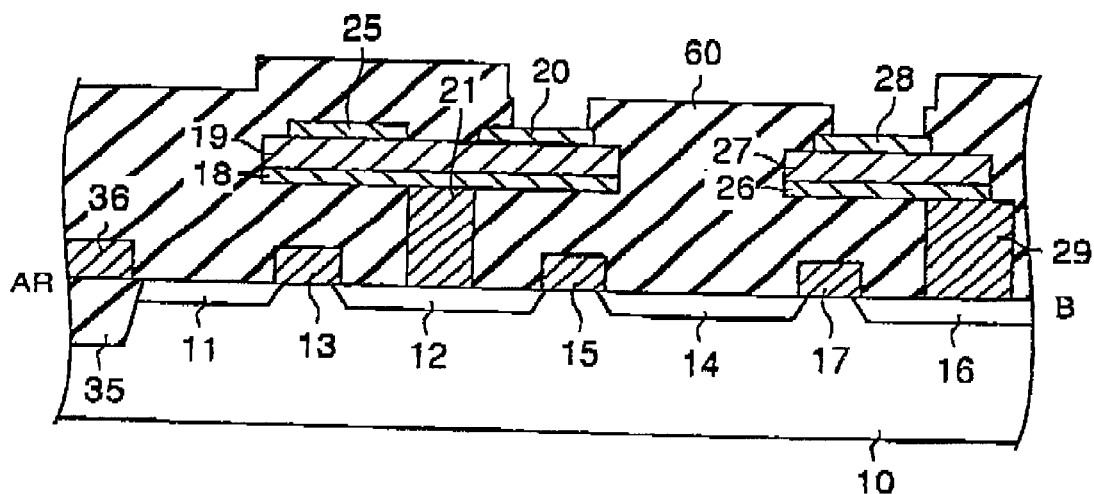
Figure 21:
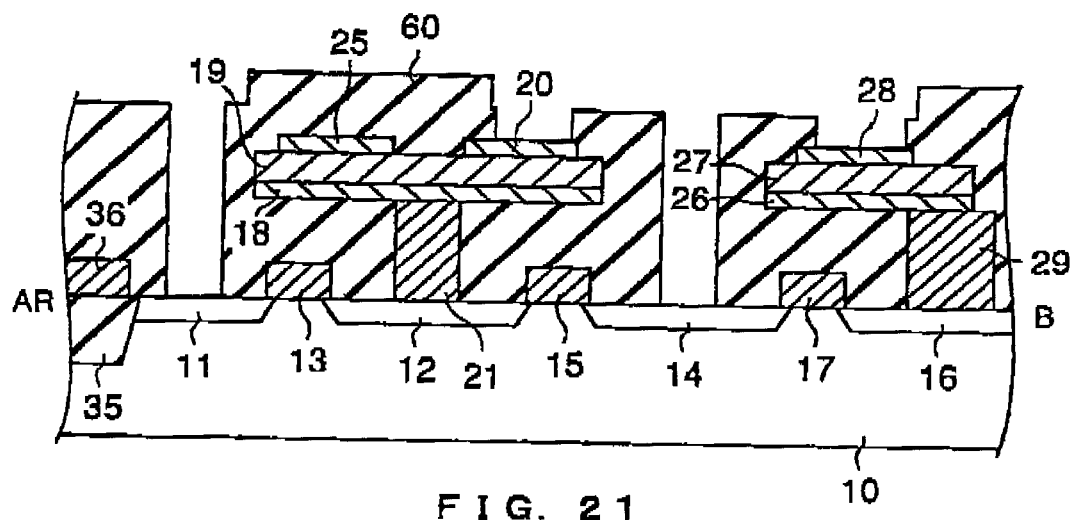
Figure 22:
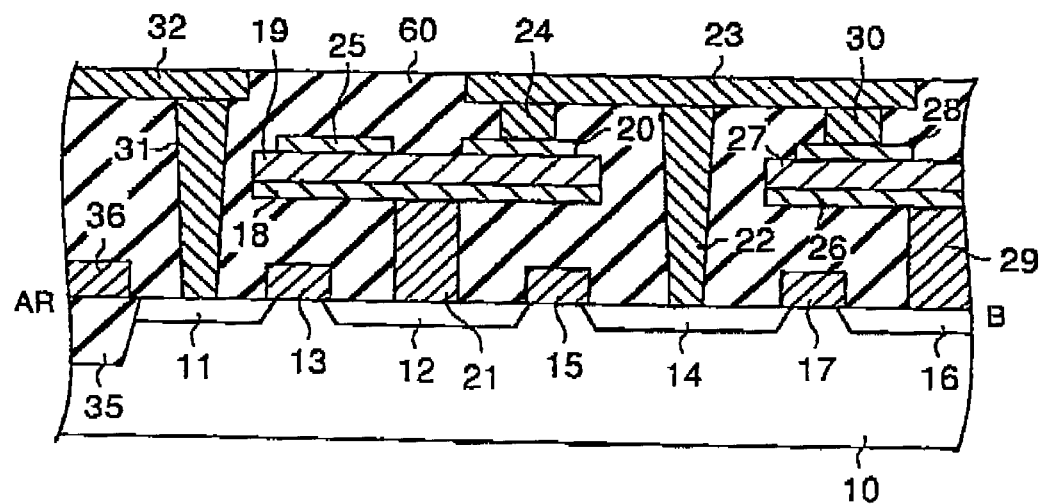

Next, as shown in FIG. 20, an opening is formed in the insulating layer 60 by removing the insulating layer 60 on the first upper electrode 20 and the second upper electrode 28. As shown in FIG. 21, an opening is formed in the insulating layer 60 by removing the insulating layer 60 on the first impurity-diffused region 11 and the third impurity-diffused region 14. As shown in FIG. 22, the first metal plug 22, the first metal layer 23, the first metal contact 24, the second metal contact 30, the first bit line plug 31, and the first bit line contact 32 are formed by a forming metal layer (e.g., aluminum) in the opening provided in the insulating layer 60.

The insulating layer 60 is then deposited on the surface shown in FIG. 22, and a contact hole is formed on the second bit line contact formation portion. The second bit line plug 33 is also formed in the contact hole, the first bit line 34 is formed on the second bit line plug 33, and the insulating layer 60 is formed as the entire surface, resulting in the structure shown in FIG. 1. Namely, Al stacked layers, i.e., Ti/TiN/Al for the first bit line 34 are deposited on the entire surface and the first bit line 34 in a desired shape is formed by the RIE method.

By using the above fabricating method, the dummy upper electrode may be fabricated by using the same steps as a normal upper electrode. Therefore, highly integrated capacitors may be fabricated without micro loading effects.

The fifth preferred embodiments according to the present invention will now be described with reference to FIGS. 23 and 24.

Each embodiment described above is a COP type capacitor structure and is used for this invention. However, this invention is not limited to a COP type capacitor. Namely, this invention may also use the offset type capacitor. In the below description, the offset type capacitor means a capacitor which is located apart from the cell transistors in a shorter direction of the memory cell block and is not provided right above the cell transistor.

Figure 23:
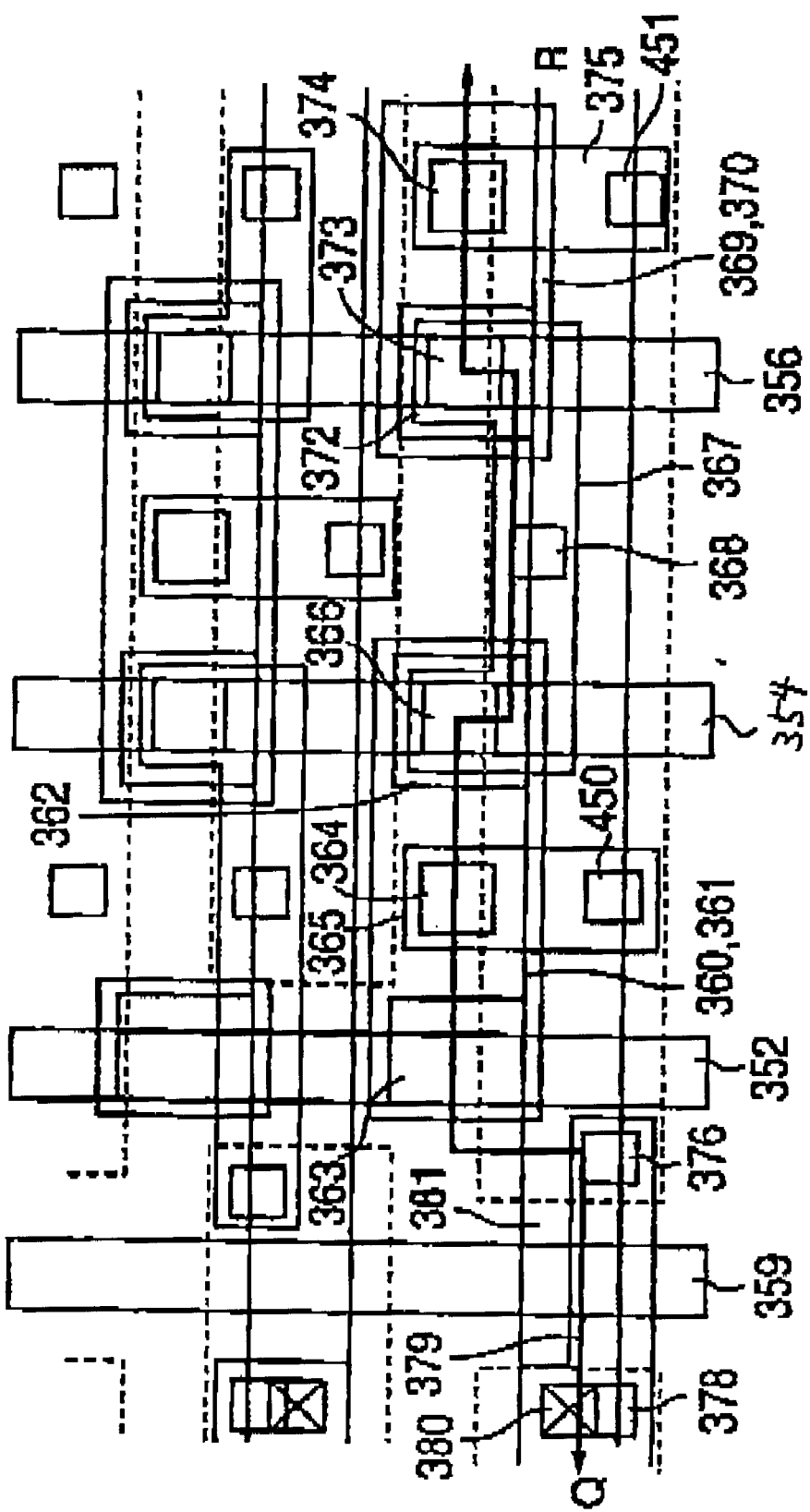
FIG. 23 shows an over view of a fifth embodiment for a structure neighboring the block selecting transistor of a semiconductor memory according to the present invention.
Figure 24:
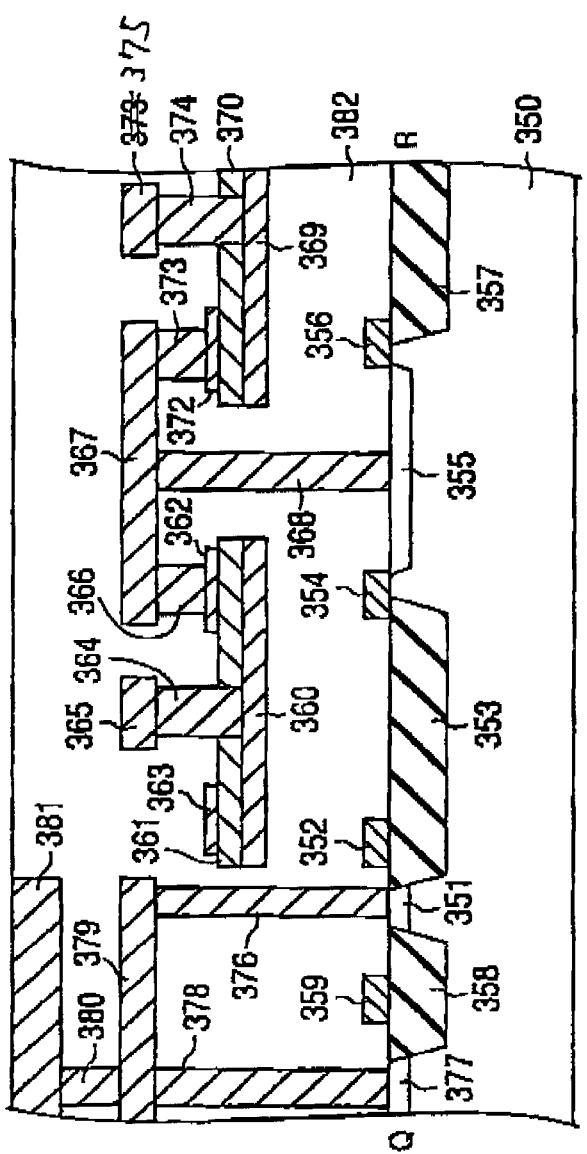
FIG. 24 shows a cross sectional view of the line "Q–R" in FIG. 23.

FIG. 23 shows the upper plane view of this embodiment, in which the cross section of the line "Q-R" is shown in FIG. 24. Further, each element shown in FIG. 24 positioned in the lateral direction corresponds to each element shown in FIG. 23 positioned in the lateral direction.

In FIG. 23, the memory cell blocks are provided in two pairs in the upper and lower side, which is elongated in the lateral direction. In this embodiment, a first in the third impurity-diffused regions 351,355,377 are formed on the semiconductor substrate 350, Further, a first isolation region 353 is formed adjacent to the first impurity-diffused region 351, and a first gate 352 is formed on the first isolation region 353.

The first impurity-diffused region 351, the first gate 352, and a portion which faces the first gate on the reverse side of the first impurity-diffused region 351 form a block selecting transistor. Also, a second gate 354 is formed on the semiconductor substrate between the first isolation region 353 and the second impurity-diffused region 355.

A second isolation region 357 is also provided in the semiconductor substrate 350 separated from and neighboring to the second impurity-diffused region. A third gate 356 is formed on the semiconductor substrate 350 and is between the second impurity-diffused region 355 and the second isolation region 357. A third isolation region 358 is formed adjacent to the first impurity-diffused region 351, and a passing word line 359 is formed on the third isolation region 358.

Further, a fist lower electrode 360 and a first ferroelectric layer 361 are stacked over the first gate 352, the first isolation region 353, and the second gate 354. A first upper electrode 362 is also formed on the first ferroelectric layer 361 and over the second gate 354. A first dummy upper electrode 363 is also formed our the first ferroelectric layer

361 and over the first gate 352. A first metal contact 364 for connecting the first lower electrode 360 is formed as penetrating in some portion of the first ferroelectric layer 361. The first metal contact 364 is connected to a first one of the first layer of the metal layer 365.

The first one of the first layer of the metal layer 365 is connected to the first metal contact 364 in an impurity region in the element region, which is shown as being surrounded by dotted lines in FIG. 23 via the contact 450. The first one of the first layer of the metal layer 365 is in the same position as the first metal contact 364 in the longitudinal direction of the memory cell block. However, the impurity region in the element region is not shown in FIG. 23.

Further, a second metal contact 366 is formed on the first upper electrode 362, and is connected to a second one of the first layer of the metal layer 367. A first metal plug 368 is also connected to the second impurity-diffused region 355 and the second one of the first layer of the metal layer 367. Further, a second lower electrode 369 is formed over the third gate 356 and the second isolation region 357, and a second ferroelectric layer 370 is provided on the second lower electrode 369. Also, a second upper electrode 372 is provided on the second ferroelectric layer 370 and over the third gate 356.

The second upper electrode 372 is connected to the second one of the first layer of the metal layer 367 via the third metal contact 373. A fourth metal contact 374 for connecting the second lower electrode 369 is formed as penetrating in some portion of the second ferroelectric layer 370. The fourth metal contact 374 is further connected to first third one of the first layer of the metal layer 375.

A third one of the first layer of the metal layer 375 is connected to the fourth metal contact 365 in the impurity-diffused region in element region, which is shown as surrounded by dotted lines in FIG. 23 via the contact 451. The third one of the first layer of the metal layer 375 is it the same position as the fourth metal contact 374 in a longitudinal direction of the memory cell block. However, the impurity-diffused region in the element region is not shown in FIG. 23.

In addition, a second metal plug 376 is connected to the first impurity-diffused region 351, and a third impurity-diffused region 377 is formed an as apposite face of the first impurity-diffused region 351 of the third isolation region 358. A first bit line plug 378 is also connected to the third impurity-diffused region 377, and is connected to the second metal plug 376 via fourth one of the first layer of the metal layer 379. The fourth one of the first layer of the metal layer 379 is connected to a bit line contact 380 over the first bit line plug 378. Further, the bit line contact 380 is connected to the first bit line 381 over the fourth one of the first layer of the metal layer 379.

Note, then is a connection between first lower electrode 360 of the first capacitor and the first one of the first layer of the metal layer 365 as shown in the cross section in FIG. 24. Also, there is no connection between the first lower electrode 360 of the first capacitor and the cell transistor shown in FIG. 24. However, as shown in FIG. 23, there is a connection between the first lower electrode 360 of the first capacitor and the first cell transistor by using a wire extending toward a direction below from the first one of the first layer of the metal layer.

Thus, there is a capacitor provided on the region separated from the element region which cell transistor is provided. Further, to element region and to upper electrode of the capacitor are connected via the contact, and the element region and the lower electrode of the capacitor are connected via the first layer of the metal layer. Thus, the cell transistor and the capacitor as provided respectively in a different region. Therefore, the area of this embodiment is larger than the area of the COP type ferroelectric memory cell structure. Further, each elements described above is covered by on insulating layer 382.

In this fifth embodiment, a dummy capacitor not connected to each cell units, impurity diffusion regions, and gate electrodes is disposed above the block selecting transistor. Thus, capacitors used as memory cells located on as outer most area is prevented. Further, according to this embodiment, it is possible to improve the characteristics of memory capacitors by using a dummy upper electrode neighboring to the block selecting transistor.

The sixth preferred embodiment according to the present invention will now be described with reference to FIGS. 25 to 33. The sixth embodiment is a method of fabricating a semiconductor memory device according to the fifth embodiment, and show fabricating steps corresponding to FIG. 24.

Figure 25:
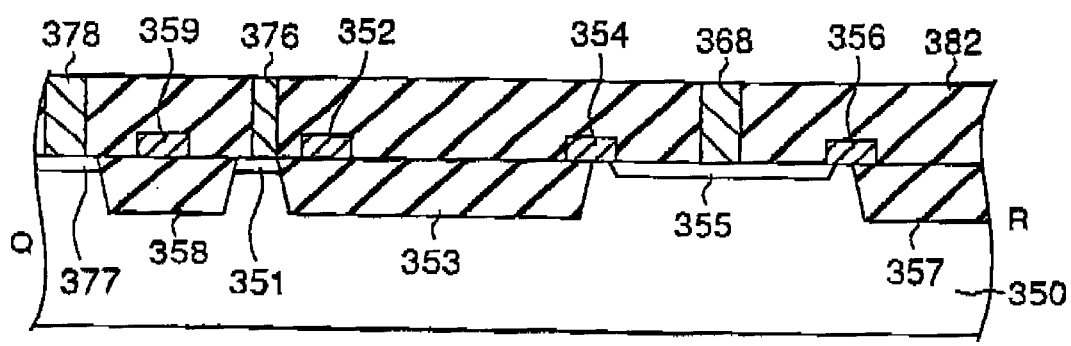
FIGS. 25 to 33 are cross sectional views illustrating a method of fabricating a semiconductor memory according to a sixth embodiment of the present invention.

As shown in FIG. 25, to first to third impurity diffusion regions 351,355,377, the first isolation region 353, the second isolation region 357, the third isolation region 358, the first to fourth gate 352,354,356, and the passing word line 359 are formed on the semiconductor substrate 350. Then, the insulating layer 382 is formed on the surface of those elements. The insulating layer 382 is formed by a LP-CVD method, and the insulating layer 382 to an interlayer insulating layer (e.g., BPSG layer). The surface of the insulating layer 382 is also flattened by a chemical mechanical polishing (CMP) method.

Then, the insulating layer 382 in the first metal plug 368 formation region, the second metal plug 376 formation region, and the first bit line plug 378 formation region are removed and a metal layer (e.g., tungsten) is buried into each formation region. Note, the polysilicon layer may be used instead of tungsten to be buried into each formation region.

Figure 26:
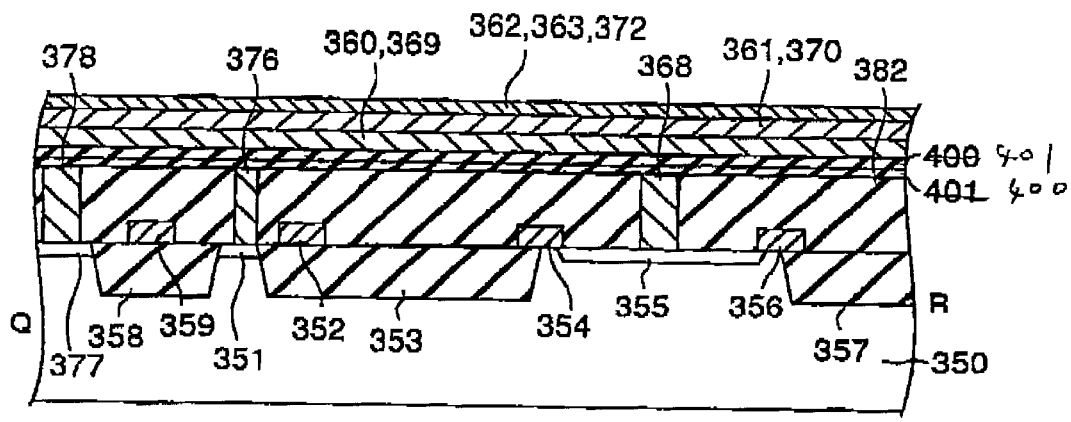
Figure 27:
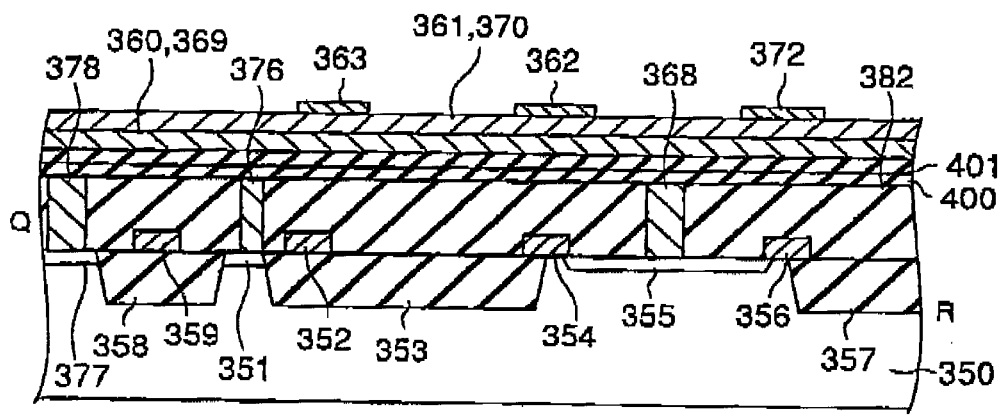
Figure 28:
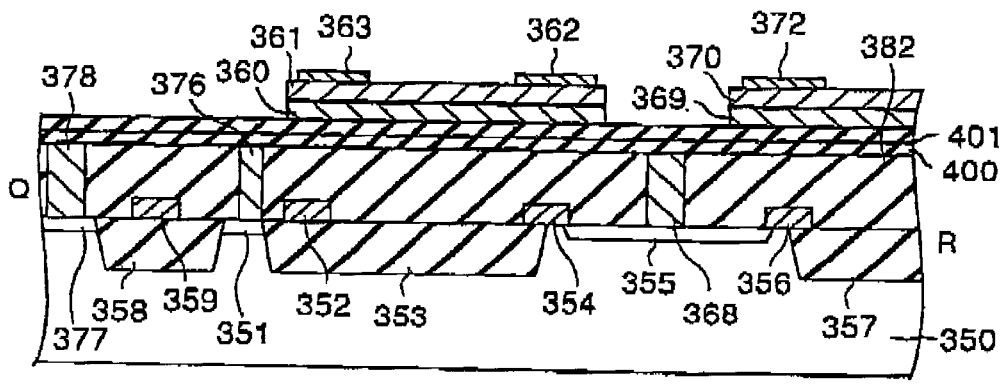

Next, as shown in FIG. 26, the insulating layer 400,401, lower electrode 360,369, ferroelectric layer 361,370, and upper electrode 362, 372, and the dummy upper electrode 363 is formed on the entire surface over the semiconductor substrate. In this step, a thin silicon nitride layer as the insulating layer 400 is first formed over the entire surface of the semiconductor substrate by using a Liquid Phase Chemical Vapor Deposition (LP-CVD) method Then, the then silicon oxide layer as the insulating layer 401 is formed by using either the LP-CVD method, Plasma CVD method, or an ordinary pressure CVD method Further, the TiN layer, Ti layer, Pt conductive layer are deposited as the lower electrodes 360,369 by using a sputter vaporized adhesion method in sequence. Then, the PZT layer as a ferroelectric layer 361,370 for the capacitor insulating layer is formed on the lower electrode. The Pt conductive layer as a capacitor upper electrode 362,372, and the dummy upper electrode 363 is then foamed by using the span vaporized adhesion method Then, as shown in FIG. 27, the upper electrode is formed in a predetermined shape by using the etching method. Thus, the first upper electrode 362, the first dummy upper electrode 363 and the second upper electrode 372 are formed. As shown in FIG. 28, a first ferroelectric layer 361, a second ferroelectric layer 370, a first lower electrode 360, and a second lower electrode 369 are formed in sequence from an upper direction by using etching with the RIE method.

Figure 29:
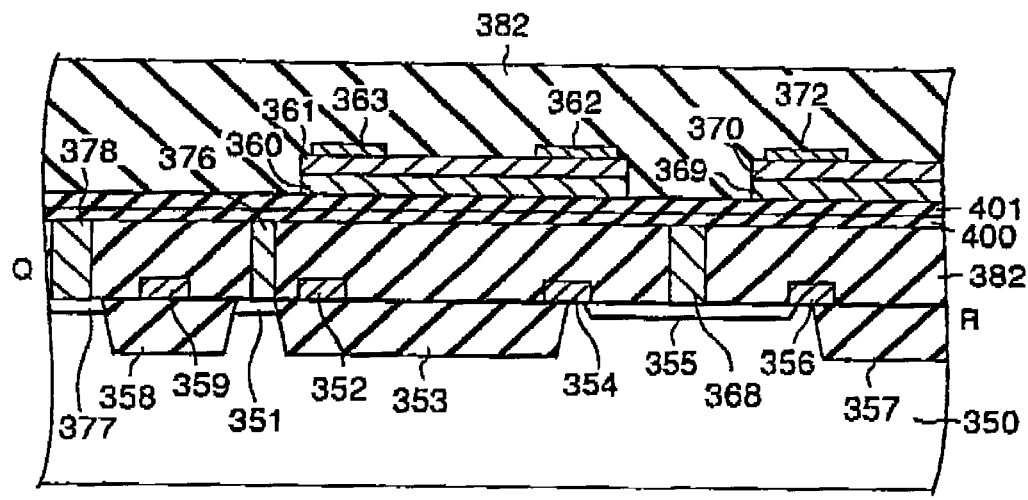
Figure 30:
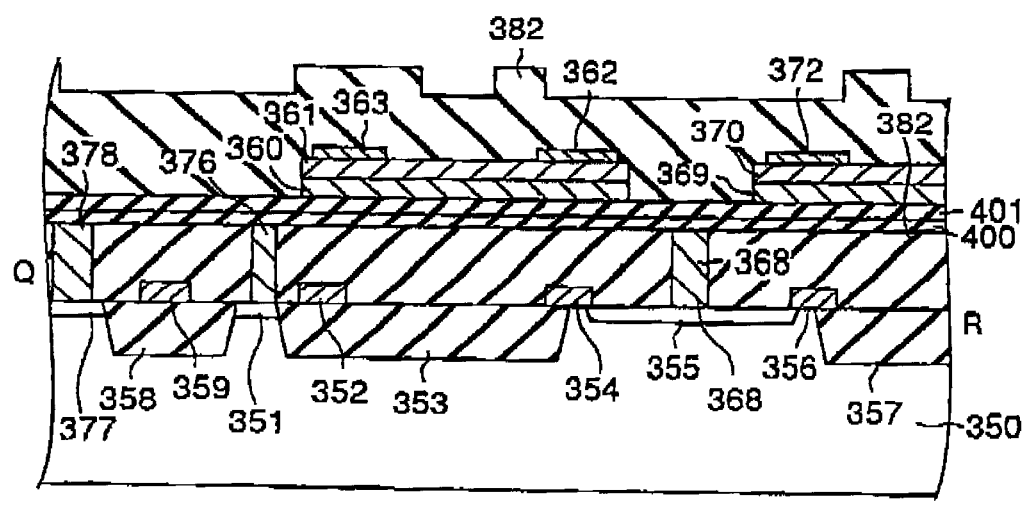
Figure 31:
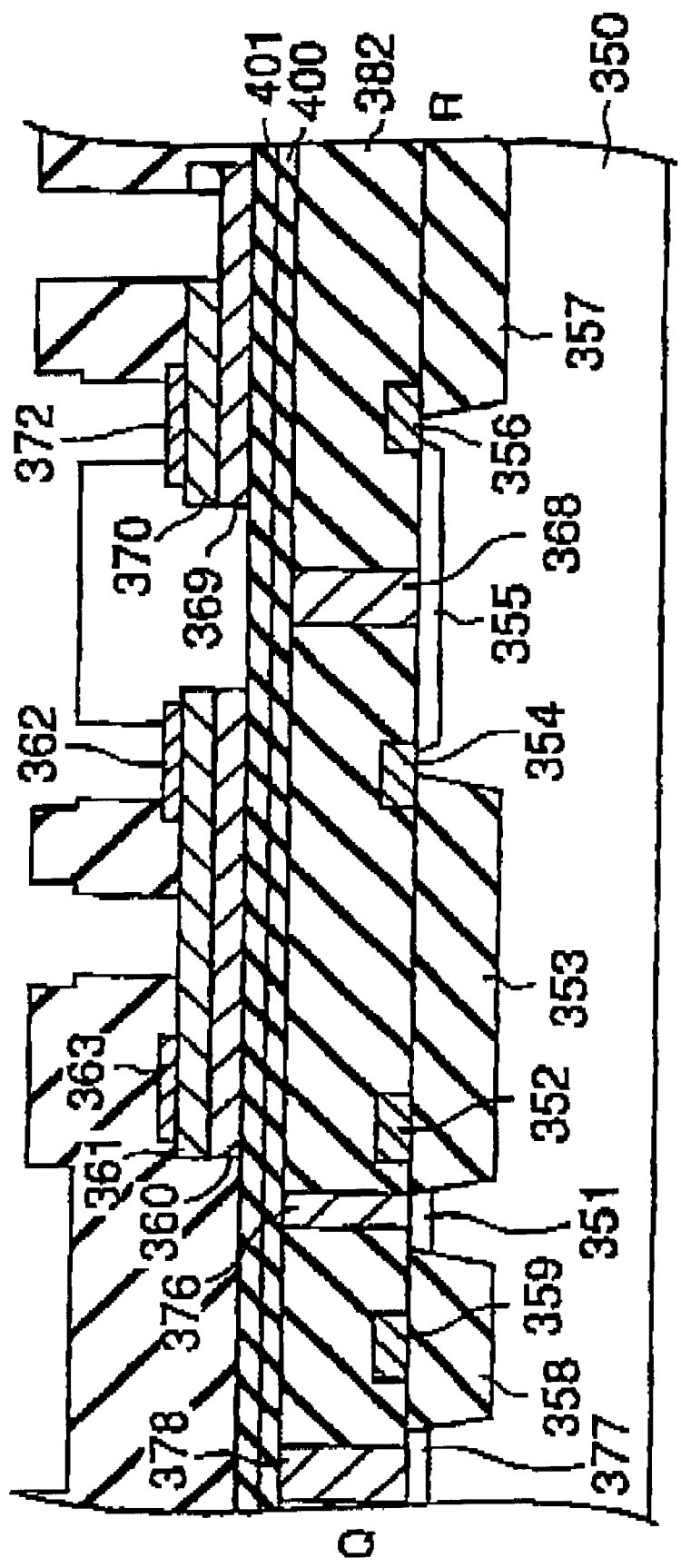

Then, as shown in FIG. 29, the insulating layer 382 is formed by using the plasma CVD method toward the entire surface. The surface of the insulating layer 382 is then flattened by using CMP method. Next, as shown in FIG. 30, each region of the insulating layer 382 in the first one of the first layer of the metal layer 365 formation region, the second one of the first layer of the metal layer 367 formation region, the third one of the first layer 375 formation region, and the fourth one of the first layer 371 an removed As shown in FIG. 31, each region of the insulating layer 382 in the first metal contact 364 formation region, second metal contact 366 formation region, third metal contact 373 formation region, fourth metal contact 374 formation region is then removed by etching. Further, each region of the first ferroelectric layer 361 and the second ferroelectric layer 370 in the first metal contact 364 formation region and the fourth metal contact 374 formation region is removed by etching.

Figure 32:
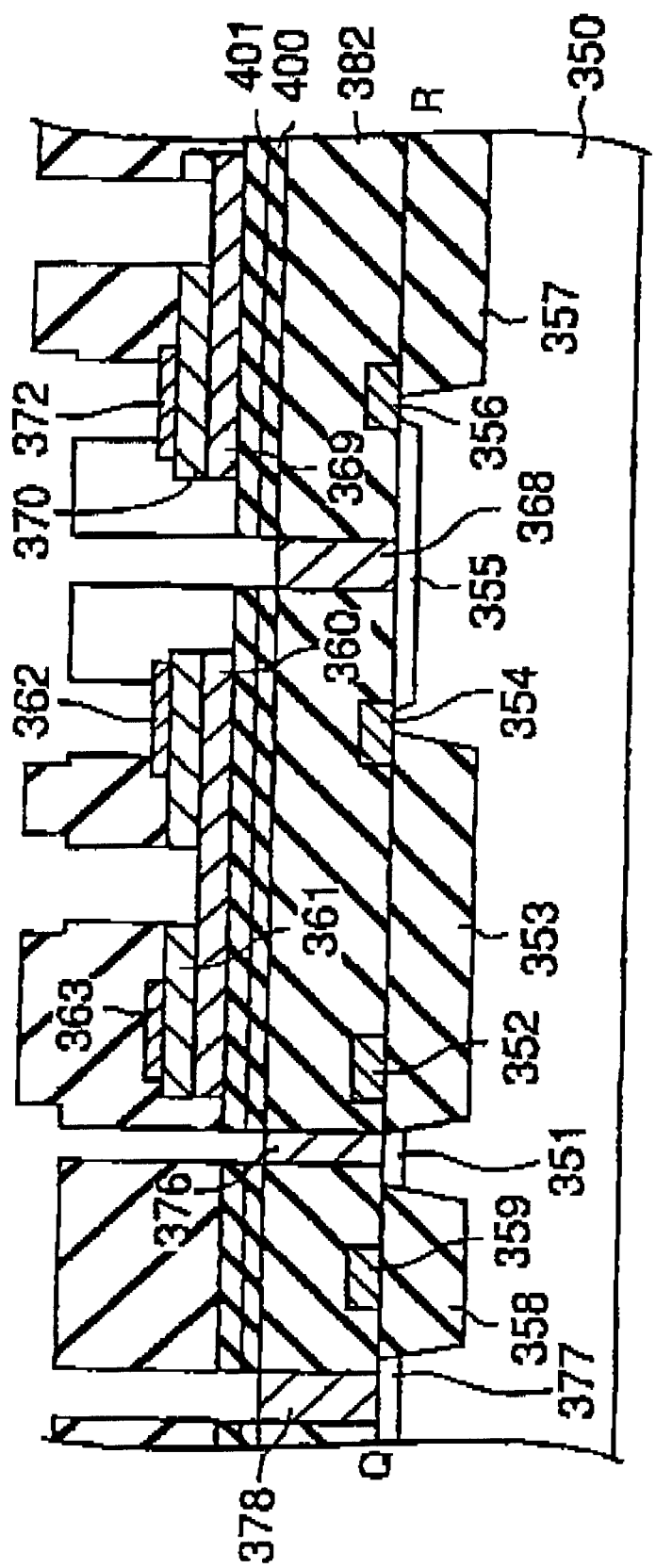

Then as shown in FIG. 32, each region of the insulting layer 382 in the first metal plug 368 formation region, the second metal plug 376 formation region, and bit line plug 378 formation region is removed by etching.

Figure 33:
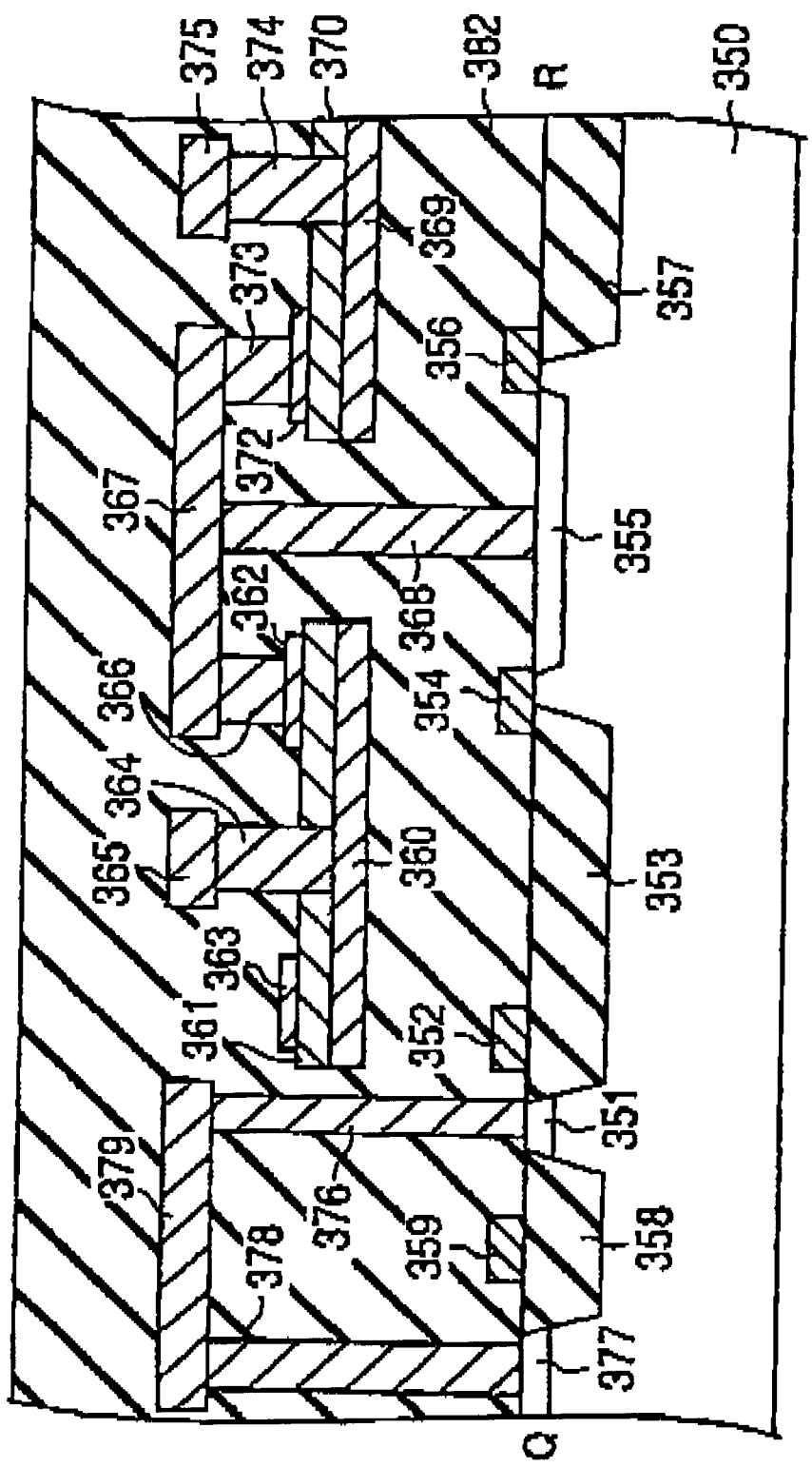

Next, as shown in FIG. 33, a metal layer (e.g., aluminum) is deposited. Then, the first metal contact 364, the first one of the first layer of the metal layer 365, the second metal contact 366, the second one of the first layer of the metal layer 367, the first metal plug 368, to third metal contact 373, the fourth metal contact 374, the third one of the first layer of the metal layer 375, the second metal plug 376, bit line plug 378, and the fourth one of the first metal layer 379 are formed.

The insulating layer 382 is then deposited on the entire surface and a region of the insulating layer 382 in the bit line contact formation region 380 is etched. Next, a metal layer is formed on the bit line contact formation region 380. Then, the bit line contact 380 is formed. The bit line 381 is also formed over the fourth one of the first layer of the metal layer to connect the bit line contact 380, and the structure shown in FIG. 24 is achieved.

In the method of fabricating the offset type semiconductor memory device, the dummy upper electrode may be made by using the acme steps as the normal electrode. Therefore, a highly integrated capacitor may be fabricated without micro loading effects.

It is further understood by those skilled in the at there the foregoing description are preferred embodiments of the disclosed devices and methods and that various changes and modifications may be made in the invention without departing from the spirit and scope thereof.

What is claimed is:

1. A semiconductor device comprising:
   a semiconductor substrate;
   a memory cell block including a plurality of transistors formed in series on the semiconductor substrate, the memory transistors having first and second impurity-diffused regions and gates formed respectively between the first and second impurity-diffused regions and being connected in series, a plurality of memory cells each having a lower electrode connected to the first impurity-diffused region, a ferroelectric film formed on the lower electrode, and a first upper electrode formed on the ferroelectric film and being connected to the second impurity-diffused region;
   a block selecting transistor formed on the semiconductor substrate and being connected to one end of the memory cell block; and
   a second upper electrode formed adjoining the block selecting transistor and being disconnected from the first upper electrode of the memory cell.

2. A semiconductor memory device according to claim 1, wherein the second upper electrode is formed on the ferroelectric film on the lower electrode.

3. A semiconductor memory device according to claim 1, wherein a distance between the second upper electrode and the first upper electrode formed adjacent to the block selecting transistor in the memory cells is equal to a distance between the first upper each electrode formed an the same lower electrode in the neighboring memory cells in the memory cell blocks.

4. A semiconductor memory device according to claim 1, wherein a volume of the second upper electrode is less than a volume of the first upper electrode.

5. A semiconductor memory device according to claim 1, further comprising:
   a plurality of said second electrodes and block selecting transistors, each second electrode being formed adjacent to a respective block selecting transistor.

6. A semiconductor memory device comprising:
   a semiconductor substrate;
   a plurality of memory transistor units formed on the semiconductor substrate and including a plurality of memory transistors having first and second impurity-diffused regions and a gate formed between the first and second impurity-diffused regions and being connected in series;
   a plurality of plug electrodes respectively connected individually to a corresponding first impurity-diffused region;
   a block selecting transistor formed on the semiconductor substrate and adjoined to one memory transistor in one end of the memory transistor units, and having impurity-diffused regions and a gate;
   a first wiring connected to the second impurity-diffused region in said one end of the memory transistor units;
   a lower electrode connected to the plug electrode connected to the first impurity-diffused region of the memory transistor in said one end of the memory cell block;
   a ferroelectric film formed on the lower electrode;
   a first upper electrode formed on the ferroelectric film and being connected to the first wiring;
   a second upper electrode formed on the ferroelectric film and being disconnected from the memory transistor, the plug electrode, the block selecting transistor and the first wiring; and
   an insulating film formed over the semiconductor substrate, the memory transistors, the plug electrode, the first and second upper electrodes, the ferroelectric film, and the lower electrode.

7. A semiconductor memory according to claim 6, wherein the first upper electrode is formed above the gate of the memory transistor and the second upper electrode is formed above the gate of the block selecting transistor.

8. A semiconductor memory device according to claim 6, wherein a volume of the second upper electrode is less than a volume of the first upper electrode.

9. A semiconductor memory device according to claim 6, further comprising:
   a plurality of said second electrodes and block selecting transistors, each second electrode being formed adjacent to a respective block selecting transistor.

10. A semiconductor memory device comprising:
    a semiconductor substrate;
    a memory transistor formed on the semiconductor substrate, and having first and second impurity diffused regions and a gate;
    a plug electrode connected to the first impurity-diffused region;

a first wiring connected to the second impurity-diffused region of the memory transistor;

a lower electrode connected to the plug electrode;

a ferroelectric film formed on the lower electrode;

a first upper electrode formed on the ferroelectric film and being connected to the first wiring;

a second upper electrode formed on the ferroelectric film and being disconnected from the memory transistor, the plug electrode, and the first wiring; and an insulating film formed over the semiconductor substrate, the memory transistor, the plug electrode, the first and second upper electrode, the ferroelectric film and the lower electrode.

11. A semiconductor memory device according to claim 10, further comprising a plate line electrode formed over the first impurity-diffused region.

12. A semiconductor memory device according to claim 11, wherein the second upper electrode is formed adjacent to and separate from the plate line electrode by a distance equal to two widths of the plate line electrode.

13. A semiconductor memory device according to claim 10, wherein a volume of the second upper electrode is less than a volume of the first upper electrode.

14. A semiconductor memory device according to claim 10, further comprising:

a plurality of said second electrodes and block selecting transistors, each second electrode being formed adjacent to a respective block selecting transistor.

15. A semiconductor memory device comprising:

a semiconductor substrate;

a memory transistor formed on the semiconductor substrate, and having first and second impurity-diffused regions and a gate;

a plug electrode connected to the first impurity-diffused region;

a block selecting transistor formed on the semiconductor substrate and being adjoined to the memory transistor, and having impurity-diffused regions and a gate;

a first wiring connected to the second impurity-diffused region of the memory transistor;

a lower electrode connected to the plug electrode;

a ferroelectric film formed on the lower electrode;

a first upper electrode formed on the ferroelectric film and being connected to the first wiring;

a second upper electrode formed over the gate of the block selecting transistor and being disconnected from the memory transistor, the plug electrode, the block selecting transistor and the first wiring; and an insulating film farmed over the semiconductor substrate, the memory transistor, the plug electrode, the first and second upper electrode, the ferroelectric film and the lower electrode.

16. A semiconductor memory device according to claim 15, wherein a volume of the second upper electrode is less than a volume of the first upper electrode.

17. (Amended) A semiconductor memory device according to claim 15, further comprising:

a plurality of said second electrodes and block selecting transistors, each second electrode being formed adjacent to a respective block selecting transistor.

18. A semiconductor memory device according to claim 15, further comprising a second insulating layer formed on the semiconductor substrate; and wherein the second upper electrode is formed in plural number on the second insulating layer.

19. A semiconductor memory device comprising:

a semiconductor substrate;

a first memory transistor formed on the semiconductor substrate, and having first and second impurity-diffused regions and a first gate;

a first plug electrode connected to the first impurity-diffused region;

a block selecting transistor formed on the semiconductor substrate and being adjoined to the memory transistor, and having impurity-diffused regions and a second gate;

a first wiring connected to the second impurity-diffused regions of the first memory transistor;

a first lower electrode connected to the first plug electrode;

a first ferroelectric film formed on the lower electrode;

a first upper electrode formed on the first ferroelectric film and being connected to the first wiring;

a second upper electrode formed over the gate of the block selecting transistor and being disconnected from the memory transistor, the first plug electrode, the block selecting transistor and the first wiring;

a second memory transistor formed on first semiconductor substrate, and having third and fourth impurity-diffused regions and a third gate;

a second plug electrode connected to the third impurity-diffused region;

a second lower electrode connected to the second plug electrode;

a second ferroelectric film formed on the second lower electrode;

a second wiring connected to the third impurity-diffused region of the second memory transistor;

a third upper electrode formed on the second ferroelectric film and being connected to the second wiring;

a fourth upper electrode formed over the gate of the second memory transistor and being disconnected from the second memory transistors, the second plug electrode, the block selecting transistor, the first wiring and the second wiring;

an insulating film formed over the semiconductor substrate, the first memory transistor, the second memory transistor, the first plug electrode, the second electrode, the first upper electrode, second upper electrode, the third upper electrode, fourth upper electrode, the first ferroelectric first the second ferroelectric film, the first lower electrode, and the second lower electrode.

20. A semiconductor memory device according to claim 19, further comprising a second insulating layer formed on the semiconductor substrate, and wherein the second upper electrode is formed in plural number an the second insulating layer.

21. A semiconductor memory device comprising:

a plurality of memory cells foamed on the semiconductors substrate and being connected in series, and respectively having a first impurity-diffused region, a second impurity-diffused region, a gate formed between the first and the second impurity-diffused regions, a plug electrode connected to the first impurity-diffused region, a lower electrode connected to the plug electrode, a ferroelectric layer formed on the lower electrode, a wiring layer connected to the second impurity-diffused region, and an upper electrode connected to the wiring layer;

a block selecting transistor formed adjacent to one and of the plurality of memory cells;

a first conductive layer formed over the block selecting transistor and being separated from the memory cells and the block selecting transistor;

a second conductive layer formed on the first impurity-diffused region and being adjacent to other end of the plurality of memory cells, and being separated from the memory cells; and a plate line formed over the second conductive layer.

22. A semiconductor memory device according to claim 21, wherein the second conductive layer includes two layers adjacent to the plate line.

23. A semiconductor memory device comprising:

a semiconductor substrate;

a memory transistor formed on the semiconductor substrate, and having first and second impurity-diffused regions and a gate;

a plug electrode connected to the first impurity-diffused regions;

a block selecting transistor formed on the semiconductor substrate and being adjoined to the memory transistor, and having impurity-diffused regions and a gate;

a first wiring connected to the second impurity-diffused regions of the memory transistor;

a lower electrode connected to the plug electrode;

a ferroelectric film formed on the lower electrode;

a first upper electrode formed ed on the ferroelectric film and being connected to the first wiring;

a second upper electrode formed over the gate of the block selecting transistor and the lower electrode, and disconnected from the memory transistor, the plug electrode, the block selecting transistor and the first wiring; and an insulating layer formed over the semiconductor substrate, the memory transistor, the plug electrode, the first and second upper electrode, the ferroelectric film and the lower electrode.

24. A semiconductor memory device comprising:

a semiconductor substrate;

a memory cell block including a plurality of memory transistors formed on the semiconductor substrate the memory transistors having first and second impurity-diffused regions and a first gate formed between the first and second impurity-diffused regions and being connected in series, a plurality of memory cells connected in series each respectively having a first lower electrode connected to the first impurity diffused region, a first ferroelectric film formed on the lower electrode and a first upper electrode formed on the first ferroelectric film and being connected to the second impurity-diffused region;

an insulating layer formed on the semiconductor substrate and being adjoined to the first impurity-diffused region of the memory transistor located in one and of the memory cell block;

a block selecting circuit formed on the semiconductor substrate, and being adjoined to the insulating layer, and having a third impurity-diffused region, first fourth impurity diffused region and second gate; and a first conductive layer formed on the semiconductor substrate, and being connected to the lower electrode of the memory cell located in one end of the memory cell block and the third impurity-diffused region.

25. A semiconductor memory device according to claim 24, wherein the conducting layer has the same material of the lower electrode and is located in a same position as the lower electrode in a vertical direction thereof.

26. A semiconductor memory device according to claim 25, further comprising a second ferroelectric layer formed on the first conductive layer, and a second conductive layer formed on the second ferroelectric layer and being disconnected from the memory cell block, the first conductive layer, the second ferroelectric layer, the third end fourth impurity-diffused regions and the second gate.

27. A semiconductor memory device according to claim 25, further comprising a wiring formed over the lower electrode supplying a signal to the first gate.

28. A semiconductor memory device according to claim 24, further comprising a second ferroelectric layer formed on the first conducive layer, and a second conductive layer formed on the second ferroelectric layer and being disconnected from the memory cell block, the first conductive layer, the second ferroelectric layer, the third and fourth impurity-diffused regions and the second gate.

29. A semiconductor memory device according to claim 24, further comprising a wiring formed over the lower electrode supplying a signal to the first gate.

* * * * *